United States Patent
Nakamura et al.

(10) Patent No.: US 10,549,311 B2
(45) Date of Patent: Feb. 4, 2020

(54) MANUFACTURING DEVICE OF ORGANIC SEMICONDUCTOR FILM

(71) Applicants: FUJIFILM Corporation, Tokyo (JP); THE UNIVERSITY OF TOKYO, Tokyo (JP)

(72) Inventors: Seigo Nakamura, Kanagawa (JP); Yoshiki Maehara, Kanagawa (JP); Yuichiro Itai, Kanagawa (JP); Yoshihisa Usami, Kanagawa (JP); Junichi Takeya, Tokyo (JP)

(73) Assignees: FUJIFILM Corporation, Tokyo (JP); THE UNIVERSITY OF TOKYO, Tokyo (JP)

( * ) Notice: Subject to any disclaimer, the term of this patent is extended or adjusted under 35 U.S.C. 154(b) by 2 days.

(21) Appl. No.: 16/041,769

(22) Filed: Jul. 21, 2018

(65) Prior Publication Data
US 2018/0326447 A1 Nov. 15, 2018

Related U.S. Application Data

(63) Continuation of application No. PCT/JP2017/000594, filed on Jan. 11, 2017.

(30) Foreign Application Priority Data

Feb. 3, 2016 (JP) .................. 2016-019102

(51) Int. Cl.
*B05C 11/04* (2006.01)
*H01L 51/00* (2006.01)
(Continued)

(52) U.S. Cl.
CPC .......... *B05C 11/045* (2013.01); *H01L 27/127* (2013.01); *H01L 51/0003* (2013.01);
(Continued)

(58) Field of Classification Search
None
See application file for complete search history.

(56) References Cited

U.S. PATENT DOCUMENTS 4,063,446 A * 12/1977 Fuhrmann ............. G01N 27/12
73/31.02
5,900,273 A * 5/1999 Rasmussen ........... B05C 5/0254
427/430.1
(Continued)

FOREIGN PATENT DOCUMENTS

JP 2008-078456 A 4/2008
JP 2013-077799 A 4/2013
(Continued)

OTHER PUBLICATIONS

International Search Report issued in PCT/JP2017/000594; dated Mar. 28, 2017.
(Continued)

*Primary Examiner* — Jethro M. Pence
(74) *Attorney, Agent, or Firm* — Studebaker & Brackett PC

(57) ABSTRACT

A device for manufacturing an organic semiconductor film, including a coating member disposed to face a substrate surface while spaced therefrom for forming the film, and forming a liquid reservoir of an organic semiconductor solution between the coating member and the substrate; a supply portion that supplies the solution; and a cover portion that covers at least a crystal growth portion of the solution. The cover portion includes a guide that guides a deposit formed of an evaporated solvent of the solution to a film-unformed region of the organic semiconductor film. While the solution is supplied between the coating member and the substrate surface by the supply portion, the coating member is moved in a first direction parallel to the substrate surface in a state of being in contact with the solution, to form the film with the crystal growth portion as a starting point.

17 Claims, 15 Drawing Sheets

(51) Int. Cl.
  *H01L 51/05* (2006.01)
  *H01L 51/10* (2006.01)
  *H01L 51/56* (2006.01)
  *H01L 27/12* (2006.01)
  *B05C 5/02* (2006.01)
  *H01L 29/786* (2006.01)
  *B05C 5/00* (2006.01)

(52) U.S. Cl.
  CPC .......... *H01L 51/05* (2013.01); *H01L 51/0512* (2013.01); *H01L 51/105* (2013.01); *H01L 51/56* (2013.01); *B05C 5/001* (2013.01); *B05C 5/022* (2013.01); *B05C 5/0254* (2013.01); *B05C 11/04* (2013.01); *H01L 29/78696* (2013.01)

(56) References Cited

U.S. PATENT DOCUMENTS

| | | | | |
|---|---|---|---|---|
| 6,139,639 | A * | 10/2000 | Kitamura | B05C 5/0208 118/680 |
| 2002/0197393 | A1* | 12/2002 | Kuwabara | H01L 51/0003 427/66 |
| 2007/0243658 | A1 | 10/2007 | Hirai et al. | |
| 2008/0286442 | A1* | 11/2008 | Ushiyama | H01L 51/0005 427/8 |
| 2008/0308037 | A1* | 12/2008 | Bulovic | B05B 17/0638 118/302 |
| 2011/0244116 | A1* | 10/2011 | Badre | B82Y 30/00 427/58 |
| 2013/0143357 | A1 | 6/2013 | Goto et al. | |
| 2015/0372233 | A1 | 12/2015 | Usami | |

FOREIGN PATENT DOCUMENTS

| | | |
|---|---|---|
| WO | 2012/026333 A1 | 3/2012 |
| WO | 2014/141838 A1 | 9/2014 |

OTHER PUBLICATIONS

Written Opinion issued in PCT/JP2017/000594; dated Mar. 28, 2017.

Extended European Search Report issued by the European Patent Office dated Jan. 23, 2019, which corresponds to EP17747154.7-1211 and is related to U.S. Appl. No. 16/041,769.

* cited by examiner

MANUFACTURING DEVICE OF ORGANIC SEMICONDUCTOR FILM

CROSS-REFERENCE TO RELATED APPLICATIONS

This application is a Continuation of PCT International Application No. PCT/JP2017/000594 filed on Jan. 11, 2017, which claims priority under 35 U.S.C. § 119(a) to Japanese Patent Application No. 2016-019102 filed on Feb. 3, 2016. The above application is hereby expressly incorporated by reference, in its entirety, into the present application.

BACKGROUND OF THE INVENTION

1. Field of the Invention

The present invention relates to a manufacturing device of an organic semiconductor film by a coating method and particularly relates to a manufacturing device of a high quality organic semiconductor film with high crystallinity.

2. Description of the Related Art

At present, an organic semiconductor is expected as a semiconductor material used for a flexible device and the like. The organic semiconductor may be formed by low-temperature coating compared with an inorganic semiconductor such as silicon. Various methods of manufacturing an organic semiconductor film using an organic semiconductor are suggested.

In JP2013-77799A, from a location at which the application of ink including an organic semiconductor material starts, the ink is dried, and the organic semiconductor material in the ink is crystallized, so as to form an organic semiconductor thin film. At this point, a nozzle portion including a nozzle body portion having an overhang portion forming a tip end face opposed to the surface of the substrate and a solution jetting portion having a jetting port that protrudes from the tip end face of the nozzle body portion toward the substrate side and extends in one direction as a longitudinal direction is used. The ink is jetted in a state in which the lower end of the solution jetting portion is spaced from the substrate, and the nozzle portion is moved in a direction perpendicular to the longitudinal direction of the jetting port while a liquid reservoir is formed with the jetted ink between the solution jetting portion and the substrate, so as to apply the ink in a line shape.

SUMMARY OF THE INVENTION

In JP2013-77799A, in a case where the evaporated solvent during the forming of the organic semiconductor thin film is deposited to an overhang portion and then falls on a crystallized organic semiconductor material, the crystallized organic semiconductor is redissolved and precipitated. Therefore, the film quality is deteriorated, and thus a high quality organic semiconductor film with high crystallinity may not be obtained. Particularly, in a case where the organic semiconductor film is continuously formed, a probability that the solvent deposited to the overhang portion falls on the crystallized organic semiconductor material increases, and it becomes difficult to obtain a high quality organic semiconductor film with high crystallinity.

An object of the present invention is to solve the problems based on the related art described above and to provide a manufacturing device of an organic semiconductor film for manufacturing the high quality organic semiconductor film with high crystallinity.

In order to achieve the object, the present invention provides a manufacturing device of an organic semiconductor film for manufacturing an organic semiconductor film by using an organic semiconductor solution, the manufacturing device comprising: a coating member that is disposed to face a surface of a substrate to be spaced therefrom for forming the organic semiconductor film and forms a liquid reservoir of the organic semiconductor solution between the coating member and the substrate; a supply portion that supplies the organic semiconductor solution to a portion between the substrate and the coating member; and a cover portion that covers at least a crystal growth portion of the organic semiconductor solution, in which the cover portion includes a guide to which an evaporated solvent of the organic semiconductor solution is deposited and which guides a deposit formed of the evaporated solvent of the organic semiconductor solution to a film-unformed region of the organic semiconductor film, and in which, while the organic semiconductor solution is supplied to a portion between the coating member and the surface of the substrate by the supply portion, the coating member is moved in a first direction parallel to the surface of the substrate in a state of being in contact with the organic semiconductor solution, to form the organic semiconductor film with the crystal growth portion as a starting point.

It is preferable that the guide of the cover portion has a tilted portion. In this case, it is preferable that the guide of the cover portion is a tilted surface of which a distance with the surface of the substrate decreases from the crystal growth portion toward the liquid reservoir.

It is preferable that the guide of the cover portion is a tilted surface that faces the crystal growth portion in a cross section of a second direction orthogonal to the first direction in a planar surface parallel to the surface of the substrate.

It is preferable that the manufacturing device further comprises a heating unit that heats at least a portion of the cover portion. It is preferable that the heating unit heats a region of the cover portion that faces the crystal growth portion.

It is preferable that the coating member and the cover portion are integrated.

It is preferable that the organic semiconductor solution includes a solvent, and the manufacturing device further comprises a vapor supply portion that supplies vapor of the solvent to an inside portion of the cover portion.

For example, a configuration in which the coating member has a coating blade of which an end surface is planar, and the coating member is disposed such that the end surface of the coating blade is spaced to be parallel to the surface of the substrate, and the liquid reservoir is formed between the end surface of the coating blade and the surface of the substrate may be provided.

For example, a configuration in which the coating member has a coating blade of which an end surface is tilted with respect to the surface of the substrate, the coating member is disposed such that the end surface of the coating blade is spaced to the surface of the substrate, and a liquid reservoir is formed between the end surface of the coating blade and the surface of the substrate may be provided.

According to the present invention, a high quality organic semiconductor film with high crystallinity can be manufactured.

DESCRIPTION OF THE PREFERRED EMBODIMENTS

Hereinafter, based on the preferable embodiment illustrated in the accompanying drawings, a manufacturing device of an organic semiconductor film according to the present invention is specifically described.

The expression "to" indicating in the numerical range described below include numerical values described on both sides. For example, the expression "$\varepsilon$ is a numerical value $\alpha$ to a numerical value $\beta$" means that the range of $\varepsilon$ is a range including the numerical value $\alpha$ and the numerical value $\beta$, and is $\alpha \leq \varepsilon \leq \beta$, in a case of being indicated by mathematical symbols.

An angle such as "parallel" and "orthogonal" includes an error range that is generally acceptable in the technical field with respect to an exact angle.

Figure 1:
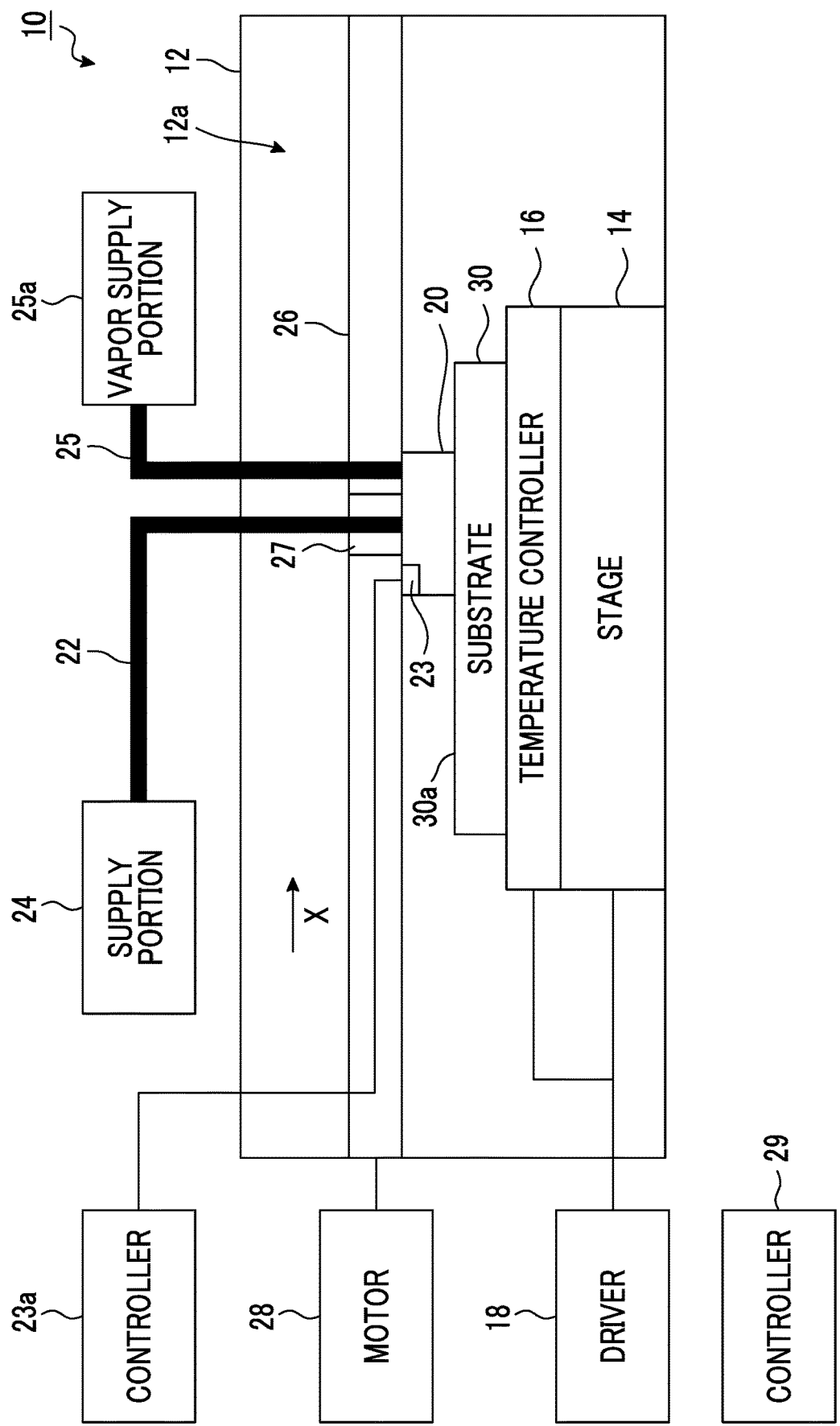
FIG. 1 is a schematic view illustrating an example of a manufacturing device of an organic semiconductor film according to an embodiment of the present invention.

FIG. 1 is a schematic view illustrating an example of a manufacturing device of an organic semiconductor film according to an embodiment of the present invention.

A manufacturing device 10 illustrated in FIG. 1 is used in the method of manufacturing the organic semiconductor film according to the embodiment of the present invention and uses a coating method.

In the manufacturing device 10, a stage 14, a temperature controller 16 disposed on the stage 14, a coating member 20, and a guide rail 26 that moves the coating member 20 in a first direction X and a direction opposite to the first direction X are provided in an inside portion 12a of a casing 12.

The stage 14 and the temperature controller 16 are connected to a driver 18, and the movement of a substrate 30 described below by the stage 14 and the temperature of the substrate 30 described below by the temperature controller 16 are controlled by the driver 18. The coating member 20 is connected to a supply portion 24 via a supply pipe 22.

The guide rail 26 is connected to a motor 28, and the coating member 20 is moved in the first direction X and the direction opposite to the first direction X by the motor 28.

The driver 18, the supply portion 24, and the motor 28 are connected to a controller 29, and the driver 18, the supply portion 24, and the motor 28 are controlled by the controller 29.

The first direction X and the direction opposite to the first direction X are directions parallel to the surface of the stage 14. Since the substrate 30 is disposed on the stage 14 such that a surface 30a of the substrate 30 and the surface of the stage 14 are parallel to each other, the direction parallel to the surface 30a of the substrate 30 is also the first direction X.

On the stage 14, the temperature controller 16 is disposed, and the substrate 30 is further disposed. On the stage 14, the substrate 30 may be moved in the first direction X and a direction opposite to the first direction X and is moved in a second direction Y (not illustrated) orthogonal to the first direction X on a surface (not illustrated) parallel to the surface 30a of the substrate 30. The stage 14 moves the substrate 30 in a direction opposite to the second direction Y.

The configuration of the stage 14 is not particularly limited, as long as the stage 14 can move the substrate 30 in the first direction X, a direction opposite thereto, the second direction Y, and a direction opposite thereto.

The temperature controller 16 sets the temperature of the substrate 30 to a predetermined temperature and maintains the temperature. The configuration of the temperature controller 16 is not particularly limited, as long as the temperature controller 16 can set the temperature of the substrate 30 as the predetermined temperature. For example, a hot plate may be used for the temperature controller 16.

The coating member 20 is disposed to be spaced to face the surface 30a of the substrate 30 for forming the organic semiconductor film 38 (see FIG. 2) and form a liquid reservoir 34 (see FIG. 2) of the organic semiconductor solution between the coating member 20 and the substrate 30. An organic semiconductor solution (see FIG. 2) for forming the organic semiconductor film 38 (see FIG. 2) is supplied from the supply portion 24 to a portion between the substrate 30 and the coating member 20, so as to form the organic semiconductor film 38 (see FIG. 2) to the surface 30a of the substrate 30 by the coating member 20. The configuration of the coating member 20 is described in detail.

The substrate 30 corresponds to a single body of the substrate 30, and as well as, in a case where a layer is formed on the surface 30a of the substrate 30, and in a case where the organic semiconductor film is formed on the surface of the layer, the surface of the layer corresponds to the surface 30a of the substrate 30.

As long as the supply pipe 22 connected to the coating member 20 may supply the organic semiconductor solution from the supply portion 24 to the coating member 20, the configuration thereof is not particularly limited, and, for example, the supply pipe 22 is provided so as to penetrate a coating blade 32 of the coating member 20. It is preferable that the supply pipe 22 has flexibility so as to follow the coating member 20 in a case where the coating member 20 moves. The number of the supply pipe 22 is not limited to one, but may be plural, and may be appropriately determined according to the size of the coating member 20 and the size of the organic semiconductor film.

The supply portion 24 supplies the organic semiconductor solution to the coating member 20 as described above, and, for example, includes a tank (not illustrated) that stores an organic semiconductor solution, a pump (not illustrated) that delivers the organic semiconductor solution in the tank to the coating member 20, and a flow meter (not illustrated) that measures a delivery amount of the organic semiconductor solution. As the supply portion 24, for example, a syringe pump may be used.

It is preferable that the temperatures of the supply portion 24 and the supply pipe 22 are timely controlled by heating. It is preferable that the temperatures of the supply portion 24 and the supply pipe 22 are set to a temperature approximately equal to the substrate temperature. An organic semiconductor solution 36 is completely dissolved by heating, such that the organic semiconductor solution 36 may be stably supplied. As the temperature difference of the organic semiconductor solution 36 and the substrate 30 is smaller during the supply, a stable liquid reservoir 34 may be formed.

For example, the manufacturing device 10 may have a configuration of providing a heating unit 23 for heating at least a portion of the cover portion described below to a predetermined temperature. In a case where the heating unit 23 is provided, the heating unit 23 is connected to a controller 23a. The controller 23a heats a cover portion described below with the heating unit 23. The controller 23a is connected to the controller 29, and the controller 23a is controlled by the controller 29. The heating unit 23 is not particularly limited, and, for example, a heater of a resistance heating system is used. The heating unit 23 is not necessarily provided.

The manufacturing device 10 may have a configuration of providing a vapor supply portion 25a for supplying vapor of the solvent of the organic semiconductor solution via a pipe 25 to a cover portion described below.

The vapor supply portion 25a supplies the vapor of the solvent of the organic semiconductor solution to the coating member 20 as described above, and, for example, includes a tank (not illustrated) that stores the solvent of the organic semiconductor solution, and a heater (not illustrated) that causes the solvent of the organic semiconductor solution in the tank to be the vapor. The vapor of the solvent may be supplied to the coating member 20 with the pressure of the vapor of the solvent, and the vapor of the solvent may be supplied to the coating member 20 by using a blower (not illustrated). An air supply system of the vapor of the solvent is appropriately set according to the vapor amount of the solvent of the organic semiconductor solution, the length of the pipe 25, and the like. It is preferable that the pipe 25 has flexibility so as to follow the coating member 20 in a case where the coating member 20 moves. The vapor supply portion 25a that supplies the vapor of the solvent of the organic semiconductor solution to the coating member 20 is not necessarily provided.

It is preferable that the pipe 25 is heated in the same manner as the tank. The condensation to the pipe 25 is suppressed by heating, and the vapor of the solvent of the organic semiconductor solution may be effectively introduced.

The guide rail 26 moves the coating member 20 in the first direction X and the direction opposite thereto. The coating member 20 is attached to the guide rail 26 by a carriage 27.

The carriage 27 may be moved in the first direction X and the direction opposite thereto by the guide rail 26, and the coating member 20 is moved in the first direction X and the direction opposite thereto, together with the carriage 27. The carriage 27 is moved in the first direction X and the direction opposite thereto by the motor 28.

The position of the carriage 27 may be calculated from a reading value of a linear scale (not illustrated) provided on the guide rail 26, and the position in the first direction X of the coating member 20 may be calculated. The carriage 27 may change the attachment height and the attachment angle of the coating member 20.

In the manufacturing device 10, the coating member 20 may be moved in the first direction X and the direction opposite thereof, and the substrate 30 may be moved in the first direction X and the direction opposite thereof. Hereinafter, the first direction X is referred to as an X direction. The second direction Y is referred to as a Y direction.

The coating member 20 and the cover portion are described in detail.

Figure 2:
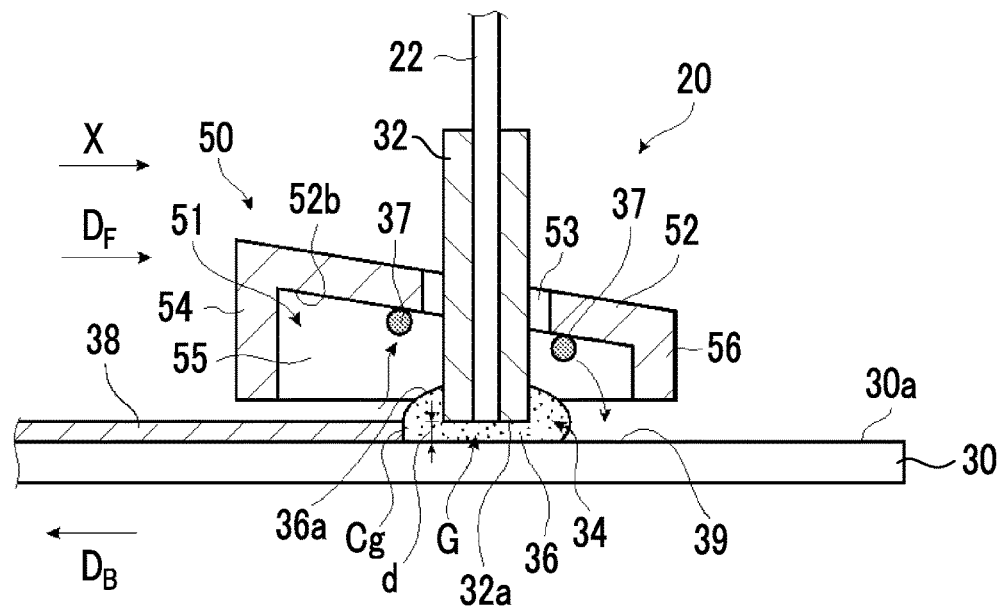
FIG. 2 is a schematic cross-sectional view illustrating a coating member and a cover portion of the manufacturing device of the organic semiconductor film according to the embodiment of the present invention.
Figure 3:
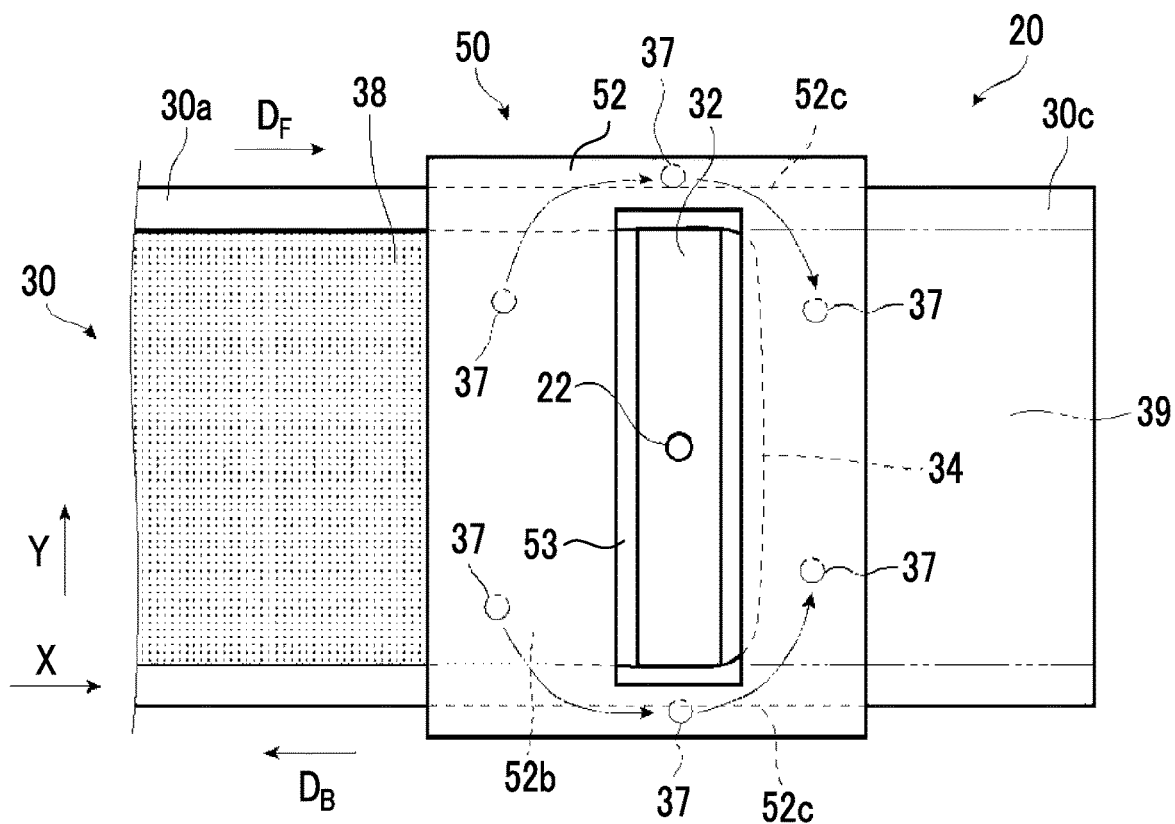
FIG. 3 is a plan view of the coating member and the cover portion.
Figure 4:
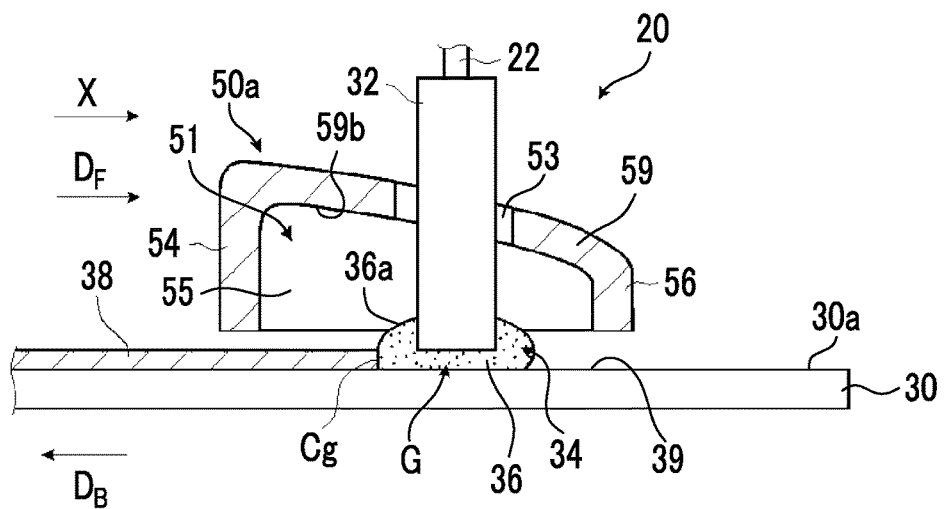
FIG. 4 is a schematic cross-sectional view illustrating a modification example of the cover portion.

FIG. 2 is a schematic cross-sectional view illustrating a coating member and a cover portion of the manufacturing device of the organic semiconductor film according to the embodiment of the present invention, FIG. 3 is a plan view of the coating member and the cover portion, and FIG. 4 is a schematic cross-sectional view illustrating a modification example of the cover portion.

As illustrated in FIGS. 2 and 3, the coating member 20 has the coating blade 32 that is formed of a flat plate. An end surface 32a of the coating blade 32 is a planar surface. The coating member 20 is disposed such that the end surface 32a of the coating blade 32 and the surface 30a of the substrate 30 are parallel to each other. The coating blade 32 is disposed so as to be spaced from the surface 30a of the substrate 30, and there is a clearance between the end surface 32a and the surface 30a of the substrate 30. This clearance is a gap G. The liquid reservoir 34 is formed between the coating blade 32 and the surface 30a of the substrate 30.

A length d of the gap G is a length between the surface 30a of the substrate 30 and the end surface 32a of the coating blade 32. The length d of the gap G is preferably 200 µm or less.

The length d of the gap G is measured by the amount of raising the carriage 27 from a state in which the coating blade 32 is in contact with the surface 30a of the substrate 30. In a case where a micrometer (not illustrated) for height adjustment is provided to the carriage 27, the length d of the gap G may be measured.

More specifically, a digital image including the side surface of the coating blade 32 and the substrate 30 is obtained, this digital image is stored in a computer, and a length between the surface 30a of the substrate 30 and the corner portion 32d of the coating blade 32 is measured on the computer based on the digital image.

In order to form the organic semiconductor film 38, the coating member 20 is moved in a $D_F$ direction in a state in which the coating member 20 is in contact with the organic semiconductor solution 36. In order to form the organic semiconductor film 38, the substrate 30 may be moved in a $D_B$ direction in a state in which the coating member 20 is in contact with the organic semiconductor solution 36.

A cover portion 50 that covers at least a crystal growth portion Cg of the organic semiconductor solution 36 is provided in the coating blade 32 of the coating member 20.

The crystal growth portion Cg of the organic semiconductor solution 36 is a region that becomes a starting point for forming the organic semiconductor film 38, and is a region in which a liquid surface 36a (see FIG. 2) of the organic semiconductor solution 36 in a $D_B$ direction of the liquid reservoir 34 is in contact with the surface 30a of the substrate 30.

With respect to the crystal growth portion Cg, a digital image including the liquid reservoir 34 and the organic semiconductor film 38 is obtained, this digital image is stored in a computer, a portion near the boundary of the liquid reservoir 34 and the organic semiconductor film 38 is visually observed based on this digital image, so as to specify the crystal growth portion Cg.

The cover portion 50 includes a guide to which the evaporated solvent of the organic semiconductor solution 36 is deposited and which guides a deposit 37 formed of the evaporated solvent of the organic semiconductor solution 36 to a film-unformed region 39 of the organic semiconductor film 38. The configuration of the guide is not particularly limited, as long as the guide may guide the deposit 37 to a film-unformed region 39 of the organic semiconductor film 38.

The cover portion 50 has a tilted portion 52 that is tilted with respect to the surface 30a of the substrate 30 and flat surface portions 54 and 56 are provided at the respective end portions in the X direction of the tilted portion 52. A side portion 55 is provided in the end portion of the Y direction of the tilted portion 52. The tilted portion 52 has a tilted surface 52b of which a distance from the surface 30a of the substrate 30 becomes shorter as it goes from the crystal growth portion Cg to the liquid reservoir 34.

An opening portion 53 that is penetrated by the coating blade 32 is provided in the tilted portion 52. As illustrated in FIG. 2, there is a clearance between the coating blade 32 and the opening portion 53 at an end portion of the Y direction of the tilted portion 52. The circumference of the coating blade 32 is covered with the cover portion 50, together with the liquid reservoir 34 and the crystal growth portion Cg, and a space on the liquid reservoir 34 and the crystal growth portion Cg is sealed by the cover portion 50.

The tilted surface 52b preferably includes a tilt of which a distance from the surface 30a of the substrate 30 monotonically decreases. In the cover portion 50, the tilted portion 52 including the tilted surface 52b is the guide. The cover portion 50 is provided in the carriage 27 and moves together with the coating blade 32.

The temperature controller 16 sets the temperature of the substrate 30 to a predetermined temperature during the forming of the organic semiconductor film 38. At this point, the solvent of the organic semiconductor solution 36 is evaporated, is deposited to the tilted surface 52b of the tilted portion 52, and is condensed, and the deposit 37 is deposited to the tilted surface 52b of the tilted portion 52. The deposit 37 moves in a $D_F$ direction along the tilt of the tilted surface 52b by the gravity, and is guided to the flat surface portion 56 side along a side 52c of the tilted portion 52 of the coating blade 32. The crystal growth portion Cg and the organic semiconductor film 38 are not provided on the flat surface portion 56 side, and thus the falling of the deposit 37 on the crystal growth portion Cg and the organic semiconductor film 38 is suppressed, and the falling of the deposit 37 on the liquid reservoir 34 is suppressed. Accordingly, the vibration due to the falling of the deposit 37 on the crystal growth portion Cg is suppressed, and the organic semiconductor film 38 is not redissolved due to the falling on the organic semiconductor film 38, and reprecipitation of the organic semiconductor film 38 is also suppressed, such that the high quality organic semiconductor film 38 with high crystallinity may be obtained.

The deposit 37 does not include flotage obtained by volatilizing the solvent of the organic semiconductor solution 36.

In a case where the deposit 37 falls on the crystal growth portion Cg and the liquid reservoir 34, the crystal growth portion Cg and the liquid reservoir 34 vibrate. The vibration of the crystal growth portion Cg and the liquid reservoir 34 adversely affects the film quality of the formed organic semiconductor film 38, and thus it is preferable that the crystal growth portion Cg and the liquid reservoir 34 are not caused to vibrate.

Even in a case where the deposit 37 falls on the surface 30a of the substrate 30, the surface 30a of the substrate 30 on the flat surface portion 56 side is the film-unformed region 39 and a region in which the organic semiconductor film 38 is to be formed. However, in a case where the deposit 37 is deposited, the deposit does not influence on the forming of the organic semiconductor film 38.

In a case where the organic semiconductor film 38 is formed, in view of the film quality such as crystallinity and the manufacturing speed, it is preferable that the temperature of the substrate 30 is high. The sealing degree of the space on the crystal growth portion Cg may increase by covering at least the crystal growth portion Cg with the cover portion 50, and thus, even in a case where the temperature of the substrate 30 increases, the solvent vapor pressure of the organic semiconductor solution 36 of an inside portion 51 of the cover portion 50 may be maintained, such that the evaporation rate of the solvent may be suppressed. Therefore, the productivity may increase by increasing manufacturing speed of the organic semiconductor film 38. In a case where the temperature of the substrate 30 is high, the probability of generating the deposit 37 also increases. However, as described above, the deposit 37 is guided to the film-unformed region 39, and the adverse effect caused by the generation of the deposit 37 according to the increase of the temperature of the substrate 30 is avoided.

In a case where the cover portion 50 is provided, the sealing degree of the space on the crystal growth portion Cg may be increased, and the wind that is generated according to the movement of the coating member 20 or the substrate 30 during the forming of the organic semiconductor film 38 does not reach the crystal growth portion Cg, and may suppress the vibration of the crystal growth portion Cg, so as to stably form the organic semiconductor film 38.

In this manner, in a case where the organic semiconductor film 38 is continuously formed, even in a case where the moving speed of the coating member 20 or the substrate 30 increases and the temperature of the substrate 30 increases, it is possible to continuously obtain the high quality organic semiconductor film 38 with high crystallinity.

The tilted portion 52 illustrated in FIG. 2 is the tilted surface 52b but is not limited to a planar surface. For example, as illustrated in FIG. 4, a tilted portion 59 may have a curved surface 59b that is curved to the surface 30a of the substrate 30. The curved surface 59b guides the deposit 37 to the flat surface portion 56 side, in the same manner as the tilted surface 52b. For example, the curved surface 59b has a tilt of which a distance from the surface 30a of the substrate 30 decreases as it goes from the crystal growth portion Cg to the liquid reservoir 34, that is, it goes from the flat surface portion 54 to the flat surface portion 56. The curved surface 59b is a guide.

Subsequently, the method of manufacturing the organic semiconductor film is described.

Figure 5:
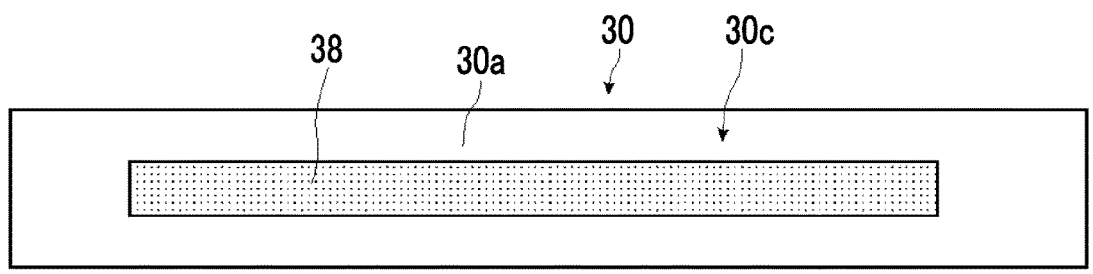
FIG. 5 is a schematic view illustrating an example of a substrate used in the manufacturing device of an organic semiconductor film according to an embodiment of the present invention.
Figure 6:
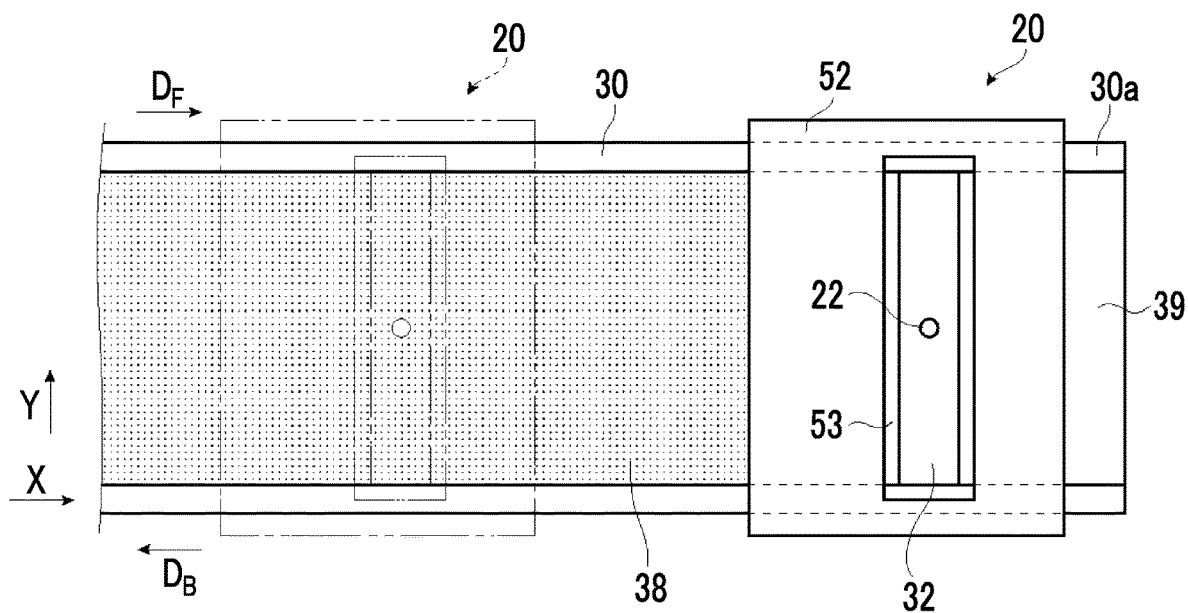
FIG. 6 is a plan view for describing a method of manufacturing the organic semiconductor film according to the embodiment of the present invention.

FIG. 5 is a schematic view illustrating an example of a substrate used in a manufacturing device of the organic semiconductor film according to the embodiment of the present invention, and FIG. 6 is a plan view for describing the method of manufacturing the organic semiconductor film according to the embodiment of the present invention.

As illustrated in FIG. 5, for example, in a case where one organic semiconductor film 38 is formed to the surface 30a of the substrate 30, a region 30c other than the organic semiconductor film 38 in the surface 30a of the substrate 30 is the film-unformed region 39 of the organic semiconductor film 38. In a case where the surface 30a is the region in which the organic semiconductor film 38 is to be formed, the region in which the organic semiconductor film 38 is not formed yet is included in the film-unformed region 39.

One organic semiconductor film 38 out of the organic semiconductor films 38 illustrated in FIG. 5 is formed by using the manufacturing device 10 (see FIG. 1), the coating member 20 is disposed by providing the gap G.

Subsequently, the organic semiconductor solution 36 is supplied from the supply portion 24 to a portion between the surface 30a of the substrate 30 and the coating blade 32 via the supply pipe 22, and the liquid reservoir 34 is formed between the coating blade 32 and the surface 30a of the substrate 30. At this point, the temperature of the substrate 30 is a temperature that is predetermined by the temperature controller 16.

While the organic semiconductor solution 36 is supplied to a portion between the coating blade 32 of the coating member 20 and the surface 30a of the substrate 30, that is, to the liquid reservoir 34, as illustrated in FIG. 6, the coating member 20 is moved to the substrate 30 in the direction $D_F$ at a predetermined moving speed in a state of being in contact with the organic semiconductor solution 36. Accordingly, using the crystal growth portion Cg of the organic semiconductor solution 36 as a starting point, the organic semiconductor film 38 is formed sequentially from the crystal growth portion Cg. In this manner, the organic semiconductor solution 36 is applied in the same direction as the direction $D_F$ in which the coating member 20 moves, that is, in the direction $D_F$, and the organic semiconductor film 38 is formed in the direction $D_F$. In this case, the solvent of the organic semiconductor solution 36 evaporates, but the deposit 37 that is formed with the solvent of the organic semiconductor solution 36 as described above does not fall on the crystal growth portion Cg, the organic semiconductor film 38 after the film formation, and the liquid reservoir 34 by the tilted surface 52b of the cover portion 50. Therefore, it is possible to obtain the high quality organic semiconductor film 38 with high crystallinity.

In a case where the organic semiconductor film 38 is continuously formed in the same manner, even in a case where the temperature of the substrate 30 is increased, and the moving speed of the coating member 20 or the substrate 30 is increased, it is possible to continuously obtain the high quality organic semiconductor film 38 with high crystallinity.

The supply amount of the organic semiconductor solution 36 is appropriately determined according to the temperature and the moving speed of the substrate 30 and the size of the organic semiconductor film 38 to be formed.

It is described that the coating member 20 is moved in the direction $D_F$, so as to form the organic semiconductor film 38, but the present invention is not limited thereto. Even in a case where the substrate 30 is moved in the direction $D_B$ at a predetermined moving speed in a state in which the coating member 20 is in contact with the organic semiconductor solution 36, the organic semiconductor film 38 may be formed in the direction $D_F$ as described above.

The direction $D_F$ is the same direction as the X direction, and the direction $D_B$ is a reverse direction of the direction $D_F$.

In a case where the boiling point of the solvent of the organic semiconductor solution 36 is set to Tb° C. and the temperature of the substrate 30 is set to Ts° C., in the step of manufacturing the organic semiconductor film 38, it is preferable that a temperature Ts of the substrate 30 is maintained at the temperature satisfying Tb −50° C.≤Ts≤Tb. In a case where the temperature Ts is in this temperature range, the film formation speed of the organic semiconductor film 38 may be increased, so as to increase the productivity of the organic semiconductor film 38.

It is more preferable that the temperature Ts of the substrate 30 in a case of forming the organic semiconductor film 38 is maintained at the temperature satisfying Tb −40° C.≤Ts≤Tb.

The moving speed of the coating member 20 in a case of forming the organic semiconductor film 38 is preferably 1 mm/min or faster and the upper limit thereof is 5 mm/min. In a case where the moving speed is 1 to 5 mm/min, the vibration of the organic semiconductor solution 36 is suppressed by the liquid reservoir 34, and the organic semiconductor film 38 may be stably formed. In a case where the substrate 30 is moved in a case of forming the organic semiconductor film 38, the moving speed of the substrate 30 may be set to be the same as the moving speed of the coating member 20.

The organic semiconductor film 38 is formed, for example, in the atmosphere and at atmospheric pressure.

Subsequently, an example of the thin film transistor manufactured by using the method of manufacturing the organic semiconductor film is described.

Figure 7:
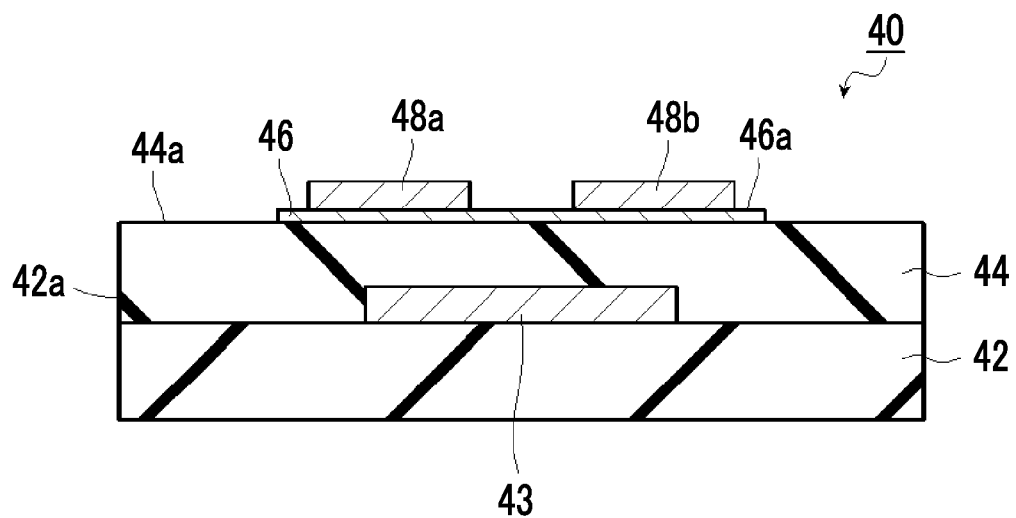
FIG. 7 is a schematic cross-sectional view illustrating an example of a thin film transistor manufactured by using the method of manufacturing the organic semiconductor film according to the embodiment of the present invention.

FIG. 7 is a schematic cross-sectional view illustrating an example of a thin film transistor manufactured by using the method of manufacturing the organic semiconductor film according to the embodiment of the present invention.

A thin film transistor 40 illustrated in FIG. 7 is a bottom gate and top contact-type transistor. In the thin film transistor 40, the gate electrode 43 is formed on a surface 42a of a substrate 42. An insulating film 44 that covers the gate electrode 43 is formed on the surface 42a of the substrate 42. An organic semiconductor layer 46 is formed on a surface 44a of the insulating film 44. The organic semiconductor layer 46 is manufactured by the method of manufacturing the organic semiconductor film. A source electrode 48a and a drain electrode 48b are formed on a surface 46a of the organic semiconductor layer 46.

In the thin film transistor 40, the organic semiconductor layer 46 is formed on the surface 44a of the insulating film 44, but, in this case, as described above, the surface 44a of the insulating film 44 corresponds to the surface 30a of the substrate 30.

A transistor in which an organic semiconductor film is formed by the method of manufacturing an organic semiconductor film is not limited to the bottom gate and top contact-type thin film transistor 40 illustrated in FIG. 7. The transistor may be a bottom gate and bottom contact-type thin film transistor, may be a top gate and top contact-type thin film transistor, or may be a top gate and bottom contact-type thin film transistor.

Figure 8:
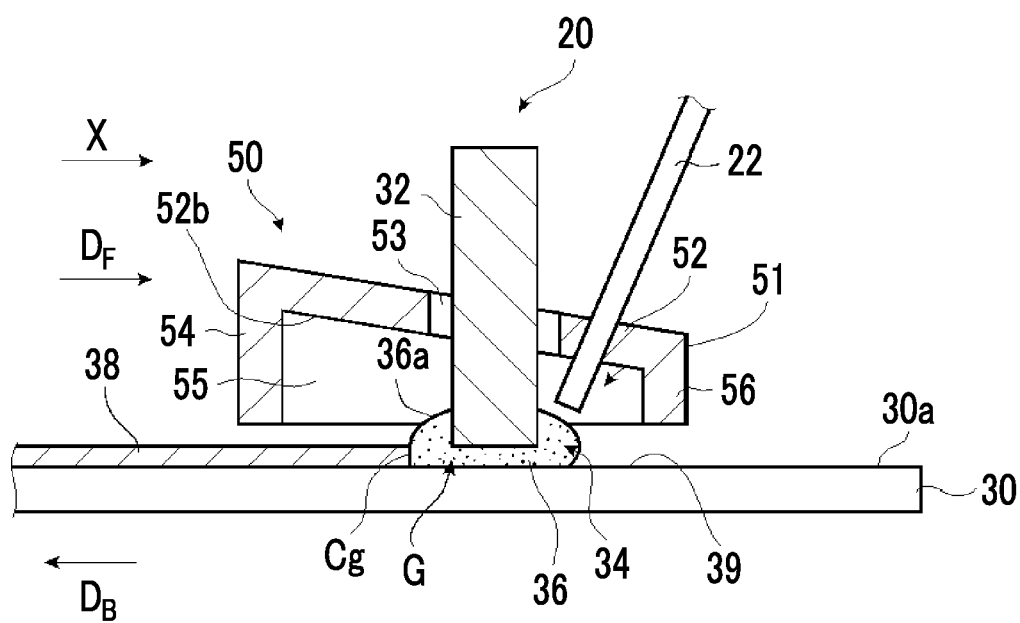
FIG. 8 is a schematic cross-sectional view illustrating a first example of a disposition position of a supply pipe in the coating member of the manufacturing device of the organic semiconductor film according to the embodiment of the present invention.
Figure 9:
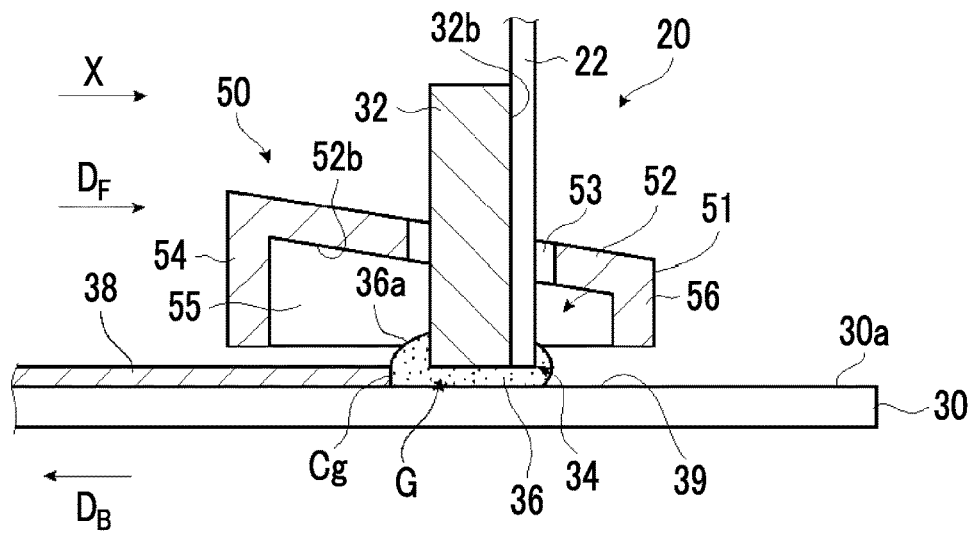
FIG. 9 is a schematic cross-sectional view illustrating a second example of the disposition position of the supply pipe in the coating member.

FIG. 8 is a schematic cross-sectional view illustrating a first example of a disposition position of a supply pipe in the coating member of the manufacturing device of the organic semiconductor film according to the embodiment of the present invention, and FIG. 9 is a schematic cross-sectional view illustrating a second example of the disposition position of the supply pipe in the coating member.

In the coating member 20, the supply pipe 22 penetrates the coating blade 32 as illustrated in FIG. 2, but is not limited thereto. Without being provided on the coating blade 32 as illustrated in FIG. 8, the supply pipe 22 may be disposed to be closer to the flat surface portion 56 side than the coating blade 32 of the tilted portion 52. The supply pipe 22 may be disposed on the crystal growth portion Cg side of the coating blade 32.

Without being provided on the coating blade 32 as illustrated in FIG. 9, the supply pipe 22 may be disposed on a side surface 32b on an opposite side to the crystal growth portion Cg of the coating blade 32. Even in the case illustrated in FIG. 9, the supply pipe 22 may be disposed on the side surface on the crystal growth portion Cg side of the coating blade 32.

A disposition number of the supply pipes 22 is not limited to one as described above, and a plurality of supply pipes 22 may be provided, and the number is appropriately determined according to the size of the coating member 20, the size of the organic semiconductor film 38, or the like.

The coating member 20 and the cover portion 50 are not limited to the configurations illustrated in FIGS. 2 and 3.

Figure 10:
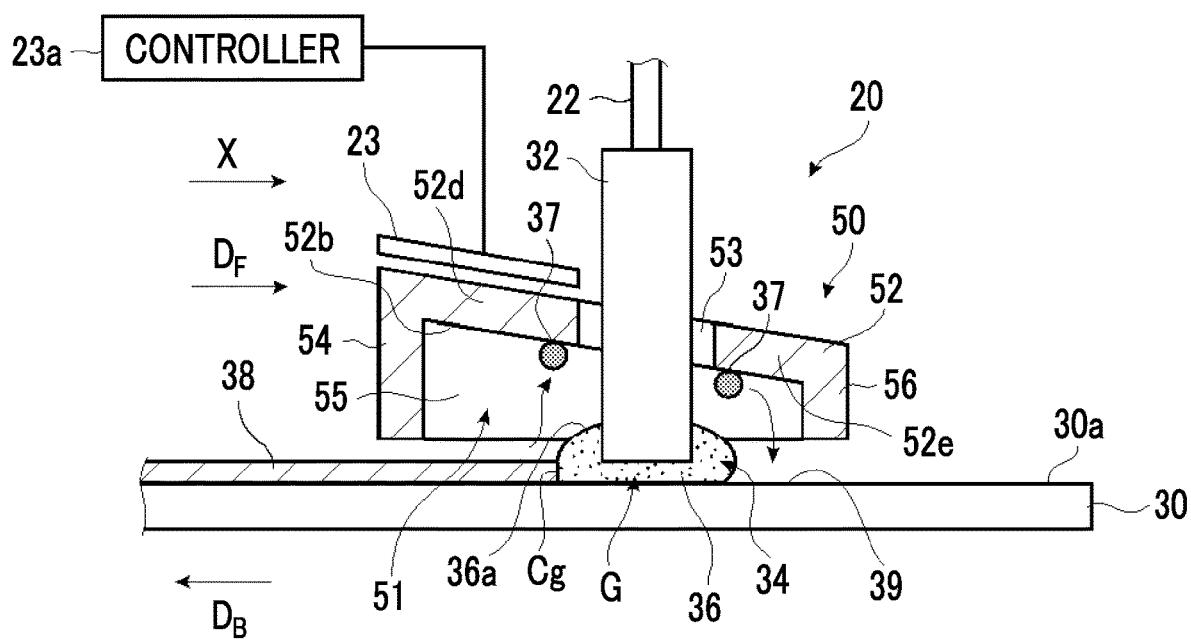
FIG. 10 is a schematic cross-sectional view illustrating a first example of the cover portion of the manufacturing device of the organic semiconductor film according to the embodiment of the present invention.

FIG. 10 is a schematic cross-sectional view illustrating a first example of the cover portion of the manufacturing device of the organic semiconductor film according to the embodiment of the present invention.

In FIG. 10, the same components as in the coating member 20 and the cover portion 50 illustrated in FIGS. 2 and 3 are denoted by the same reference numerals, and detailed descriptions thereof are omitted.

In the cover portion 50 illustrated in FIG. 10, the heating unit 23 is provided in a region 52d that faces the crystal growth portion Cg.

For example, the heating unit 23 is a heater of the resistance heating system as described above and is connected to the controller 23a as described above. The cover portion 50 is heated by the heating unit 23. Therefore, even in a case where the solvent of the organic semiconductor solution 36 is evaporated and deposited to the cover portion 50, the forming of the deposit 37 is suppressed. In a case where the deposit 37 that is formed of the evaporated solvent of the organic semiconductor solution 36 is deposited to the tilted surface 52b, the deposit 37 is heated and easily moves along the tilted surface 52b, and thus the deposit 37 is easily guided to the flat surface portion 56 side. Accordingly, falling of the deposit 37 on the crystal growth portion Cg and the organic semiconductor film 38 is further suppressed, and the falling on the liquid reservoir 34 is further suppressed.

In a case where the cover portion 50 is heated by the heating unit 23, the solvent vapor pressure of the inside portion 51 also increases, and thus the state is more preferable for crystal growing. In this manner, it is possible to more easily obtain the high quality organic semiconductor film 38 with high crystallinity.

The heating unit 23 is provided in the region 52d that faces the crystal growth portion Cg but is not limited thereto, and the heating unit 23 heats at least a portion thereof. The heating unit 23 may be provided in a region 52e on the flat surface portion 56 side of the liquid reservoir 34 in the tilted portion 52, and the heating unit 23 may be provided on the entire surface of the tilted portion 52.

In a case where the cover portion 50 is heated by the heating unit 23, the heating temperature is preferably the temperature of the substrate 30 or higher.

Figure 11:
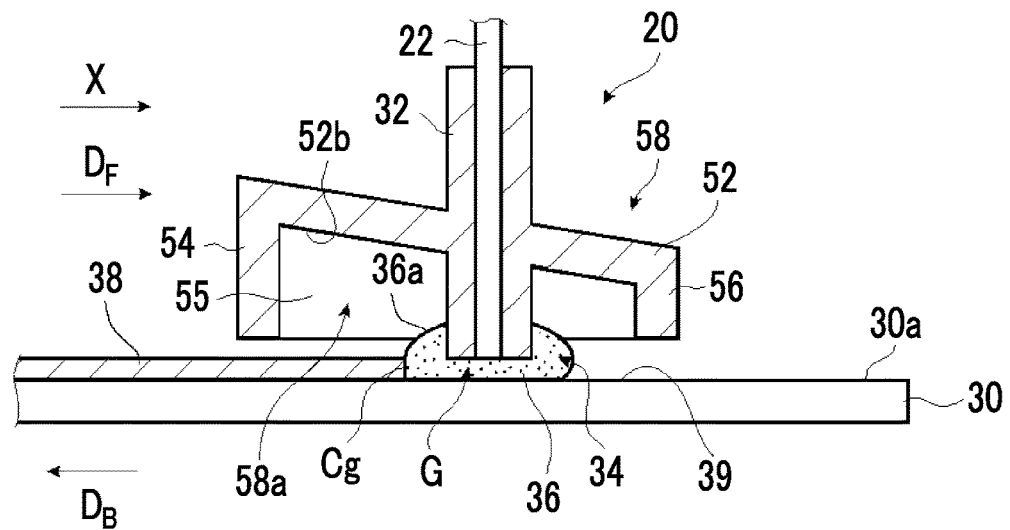
FIG. 11 is a schematic cross-sectional view illustrating a second example of the cover portion of the manufacturing device of an organic semiconductor film according to the embodiment of the present invention.
Figure 12:
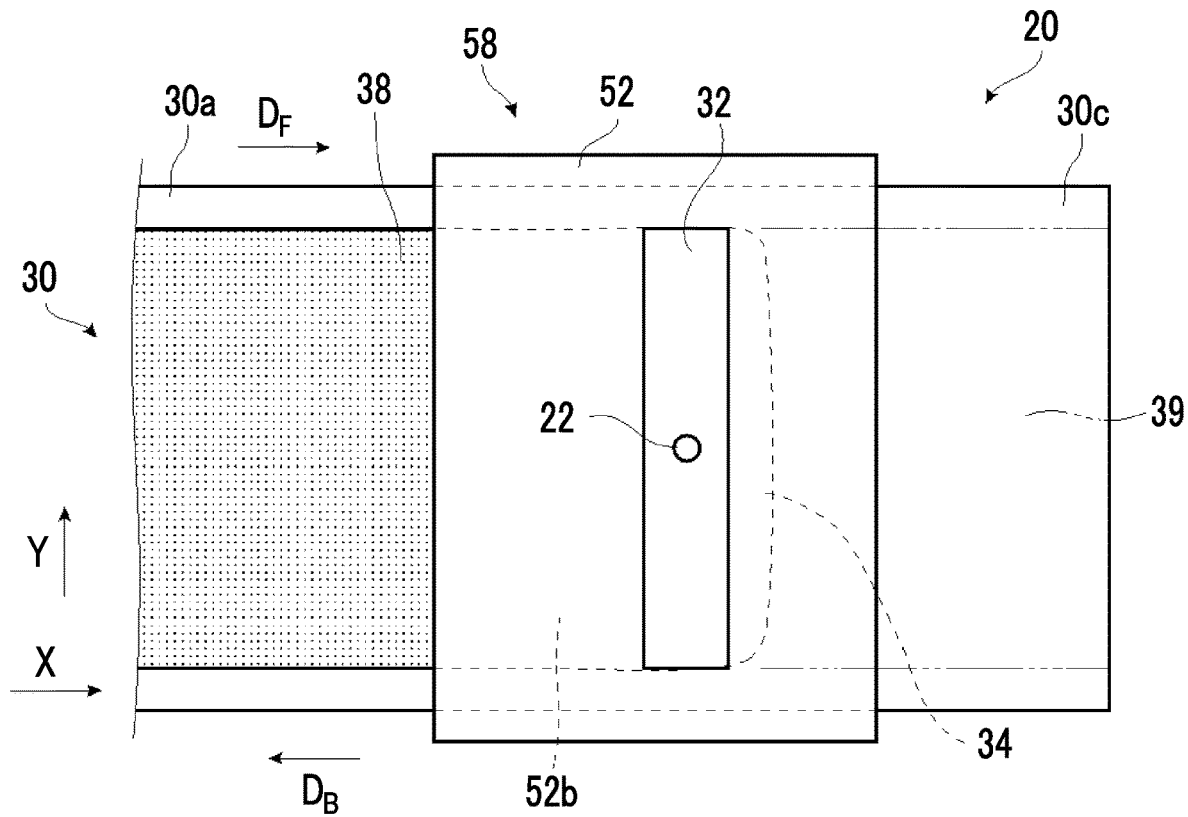
FIG. 12 is a plan view of the second example of the cover portion.

FIG. 11 is a schematic cross-sectional view illustrating a second example of the cover portion of the manufacturing device of an organic semiconductor film according to the embodiment of the present invention, and FIG. 12 is a plan view of the second example of the cover portion.

In FIGS. 11 and 12, the same components as in the coating member 20 and the cover portion 50 illustrated in FIGS. 2 and 3 are denoted by the same reference numerals, and detailed descriptions thereof are omitted.

A cover portion 58 illustrated in FIGS. 11 and 12 is different from the cover portion 50 illustrated in FIGS. 2 and 3, in that the coating blade 32 and the cover portion 58 are integrated, and the other configurations are the same as the cover portion 50 illustrated in FIGS. 2 and 3.

As illustrated in FIGS. 11 and 12, the coating blade 32 and the cover portion 58 are integrated, the opening portion 53 is not provided, and there is no clearance near the coating blade 32. In a case where the coating blade 32 and the cover portion 58 are integrated without a clearance, the sealing degree of the space on the crystal growth portion Cg may be increased. Therefore, in a case where the solvent of the organic semiconductor solution 36 is evaporated during the forming of the organic semiconductor film 38, the solvent vapor pressure of an inside portion 58a may be maintained to at a higher level, and the evaporation rate of the solvent may be suppressed. Accordingly, it is possible to more easily obtain the organic semiconductor film 38 with higher crystallinity.

Since the cover portion 58 does not have a clearance, the leakage of the vapor of the solvent to the outside is suppressed, and the fluctuation of the solvent vapor pressure of the inside portion 58a is suppressed, such that the organic semiconductor film 38 may be formed in a stable manner.

Figure 13:
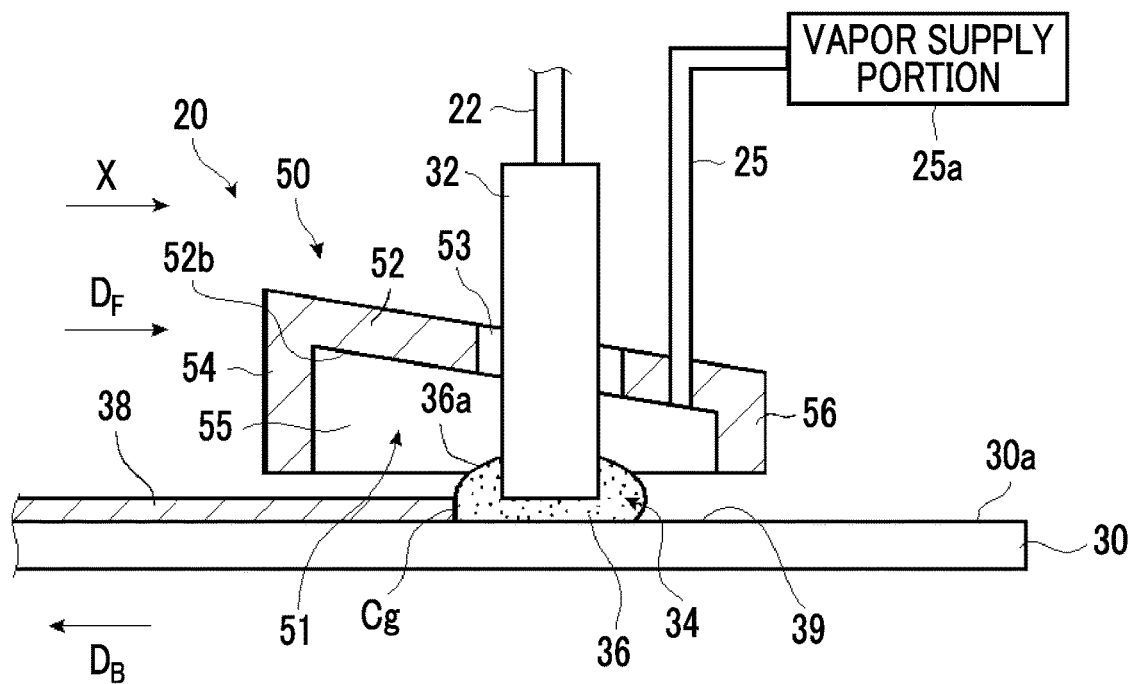
FIG. 13 is a schematic cross-sectional view illustrating a third example of the cover portion of a manufacturing device of an organic semiconductor film according to the embodiment of the present invention.
Figure 14:
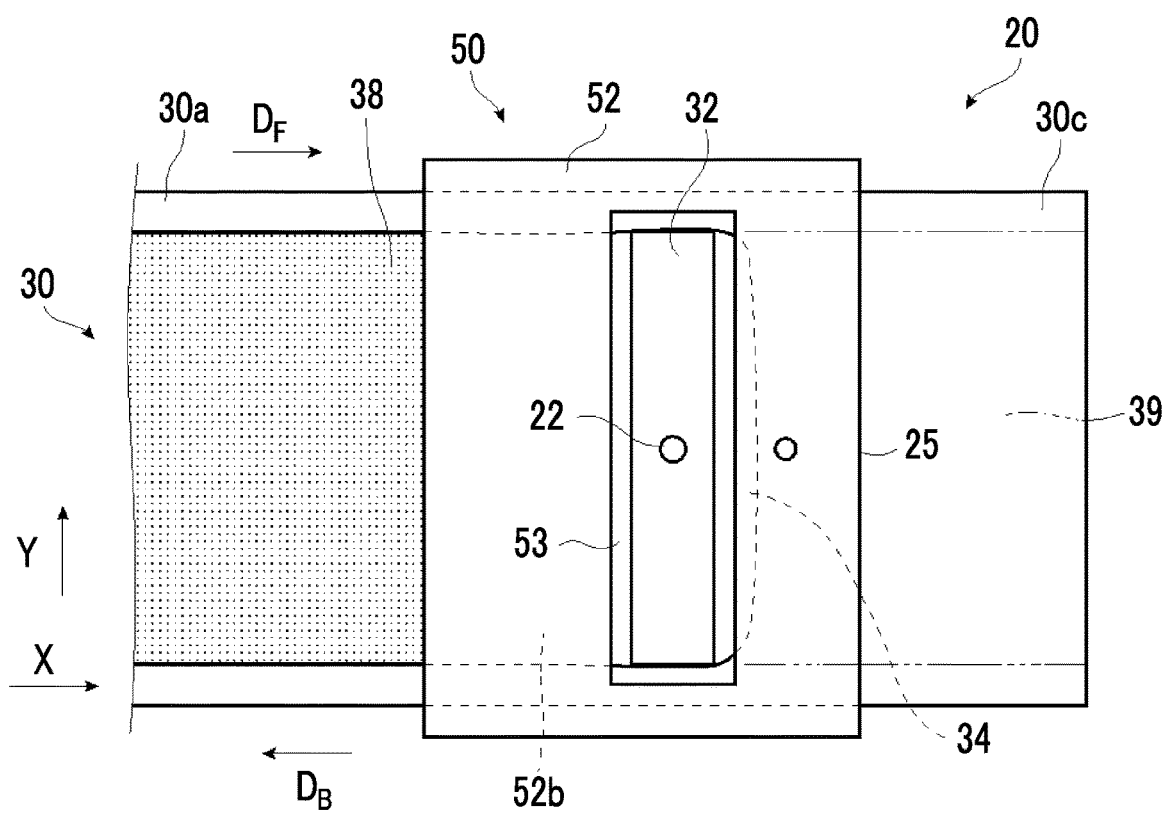
FIG. 14 is a plan view of the third example of the cover portion.
Figure 15:
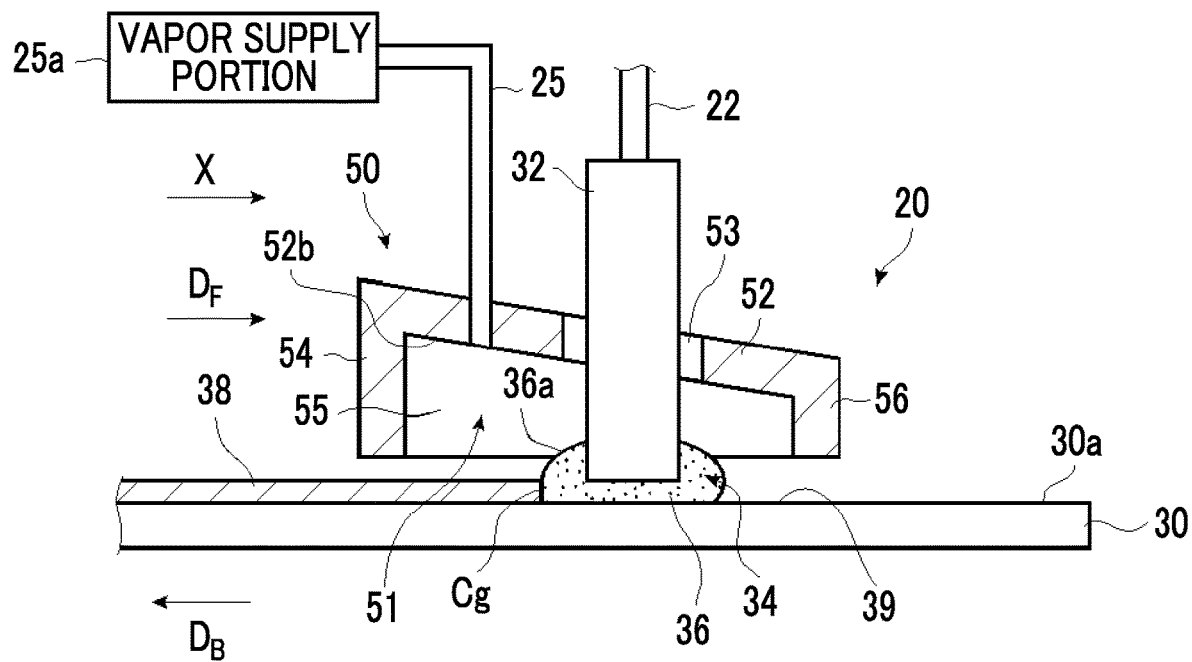
FIG. 15 is a schematic cross-sectional view illustrating a modification example of a third example of the cover portion.

FIG. 13 is a schematic cross-sectional view illustrating a third example of the cover portion of a manufacturing device of an organic semiconductor film according to the embodiment of the present invention, FIG. 14 is a plan view of the third example of the cover portion, and FIG. 15 is a schematic cross-sectional view illustrating a modification example of the third example of the cover portion.

In FIGS. 13 to 15, the same components as in the coating member 20 and the cover portion 50 illustrated in FIGS. 2 and 3 are denoted by the same reference numerals, and detailed descriptions thereof are omitted.

The coating member 20 and the cover portion 50 illustrated in FIGS. 13 and 14 are different from the coating member 20 and the cover portion 50 illustrated in FIGS. 2 and 3, in that the vapor supply portion 25a is connected to a portion between the coating blade 32 of the cover portion 50 and the flat surface portion 56 via the pipe 25, and the other configuration is the same as the coating member 20 and the cover portion 50 illustrated in FIGS. 2 and 3.

For example, the vapor of solvent of the organic semiconductor solution 36 is supplied to the cover portion 50 by the vapor supply portion 25a. Accordingly, the solvent vapor pressure of the inside portion 51 increases during the forming of the organic semiconductor film 38, and thus the evaporation rate of the solvent of the organic semiconductor solution 36 may be suppressed. Accordingly, it is possible to obtain the organic semiconductor film 38 with higher crystallinity.

As illustrated in FIG. 15, the pipe 25 may be provided on the crystal growth portion Cg side. In this case, by the vapor of the solvent from the vapor supply portion 25a, in the inside portion 51, the solvent vapor pressure particularly on the crystal growth portion Cg is increased, so as to suppress the evaporation rate of the solvent. Therefore, it is preferable that the pipe 25 is provided on the crystal growth portion Cg side.

The number of the pipes 25 is not limited to one, a plurality of the pipes 25 may be provided, and the number is appropriately set according to the size of the organic semiconductor film 38 to be formed, a required quality of the organic semiconductor film 38, or the like. It is preferable that the temperature of the supplied vapor of the solvent of the organic semiconductor solution 36 is the same as the temperature of the substrate 30.

In the coating member 20 and the cover portion 50 illustrated in FIGS. 2 and 3, at least two of providing the heating unit 23, supplying the vapor of the solvent by the vapor supply portion 25a, and integrating the cover portion 50 and the coating blade 32 may be combined, or all of those may be combined.

Figure 16:
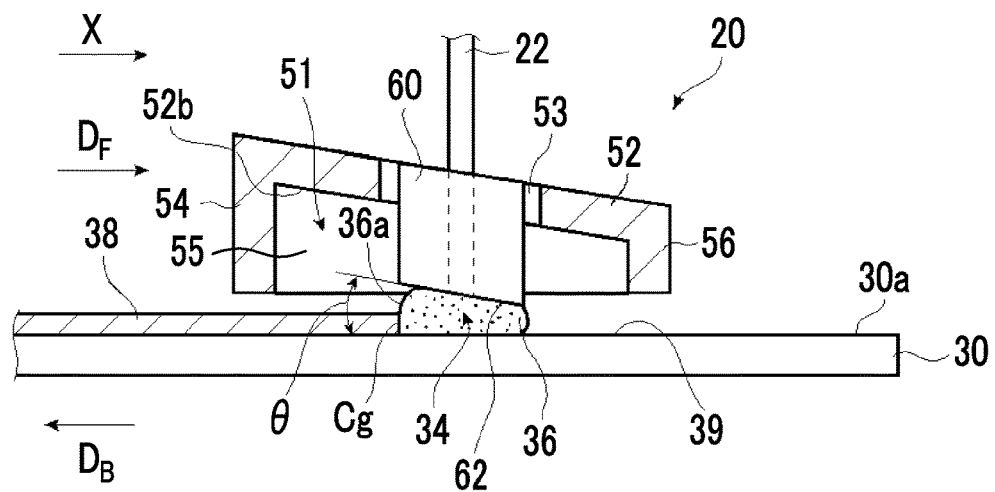
FIG. 16 is a schematic cross-sectional view illustrating another example of a coating member of the manufacturing device of the organic semiconductor film according to the embodiment of the present invention.

FIG. 16 is a schematic cross-sectional view illustrating another example of a coating member of the manufacturing device of the organic semiconductor film according to the embodiment of the present invention.

In FIG. 16, the same components as in the coating member 20 and the cover portion 50 illustrated in FIGS. 2 and 3 are denoted by the same reference numerals, and detailed descriptions thereof are omitted.

The coating member 20 illustrated in FIG. 16 is different from the coating member 20 illustrated in FIGS. 2 and 3, in the configuration of a coating blade 60, and the other configuration is the same as that in the coating member 20 illustrated in FIGS. 2 and 3.

In the coating blade 60, an end surface 62 that faces the surface 30a of the substrate 30 is tilted with respect to the surface 30a of the substrate 30. The coating member 20 is disposed such that the end surface 62 of the coating blade 60 is spaced from the surface 30a of the substrate 30, and the liquid reservoir 34 is formed between the end surface 62 of the coating blade 60 and the surface 30a of the substrate 30.

Since the end surface 62 of the coating blade 60 is tilted, the vibration of the liquid reservoir 34 may be suppressed compared with the coating blade 32 of which the end surface 32a is parallel to the surface 30a of the substrate 30 illustrated in FIG. 2. Accordingly, it is possible to obtain the organic semiconductor film 38 with higher crystallinity.

For example, the tilt angle θ of the end surface 62 of the coating blade 60 to the surface 30a of the substrate 30 is preferably 1° to 14°. The tilt angle θ is more preferably 1° to 9° and even more preferably 4° to 9°.

In a case where the tilt angle θ is 1° to 14°, the organic semiconductor solution 36 in an appropriate amount may be held, and a crystal film having high mobility may be manufactured at a fast moving speed. The tilt angle θ of the coating blade 60 is an angle formed by the surface 30a of the substrate 30 and the end surface 62 of the coating blade 60. The length of the coating blade 60 is about 2 cm.

As the coating member 20 illustrated in FIG. 16, in a case where the coating blade 60 of which the end surface 62 is tilted with respect to the surface 30a of the substrate 30 is provided, in a case where the boiling point of the solvent of the organic semiconductor solution 36 is set to Tb° C. and the temperature of the substrate 30 is set to Ts° C., in the step of manufacturing the organic semiconductor film 38, it is preferable that a temperature Ts of the substrate 30 is maintained at the temperature satisfying Tb−30° C.≤Ts≤Tb. In a case where the temperature Ts is in this temperature range, the film formation speed of the organic semiconductor film 38 may be increased, so as to increase the productivity of the organic semiconductor film 38.

It is more preferable that the temperature Ts of the substrate 30 in a case of forming the organic semiconductor film 38 is maintained at the temperature satisfying Tb−20° C.≤Ts≤Tb.

The moving speed of the coating blade 60 of the coating member 20 in a case of forming the organic semiconductor film 38 is preferably 5 mm/min or faster and more preferably 10 mm/min or faster. In a case where the moving speed is 5 mm/min or faster, with respect to the organic semiconductor film 38, fast film formation speed may be obtained, so as to increase the productivity. The upper limit of the moving speed is about 100 mm/min, and in a case where the moving speed in the tilted coating blade 60 is up to about 100 mm/min, the organic semiconductor film with high crystallinity and high mobility may be obtained. In the configuration illustrated in FIG. 16, in a case where the substrate 30 is moved in a state in which the coating member 20 is in contact with the organic semiconductor solution 36 during the forming of the organic semiconductor film 38, the moving speed of the tilted coating blade 60 of the substrate 30 may be set to be the same as the moving speed of the coating member 20.

Also in the coating member 20 and the cover portion 50 illustrated in FIG. 16, the heating unit 23 may be provided, or the vapor of the solvent may be supplied to the inside of the cover portion 50 illustrated in FIG. 16 by the vapor supply portion 25a. The cover portion 50 and the coating blade 32 illustrated in FIG. 16 may be integrated. Among these, at least two of these may be combined or all of those may be combined.

Figure 17:
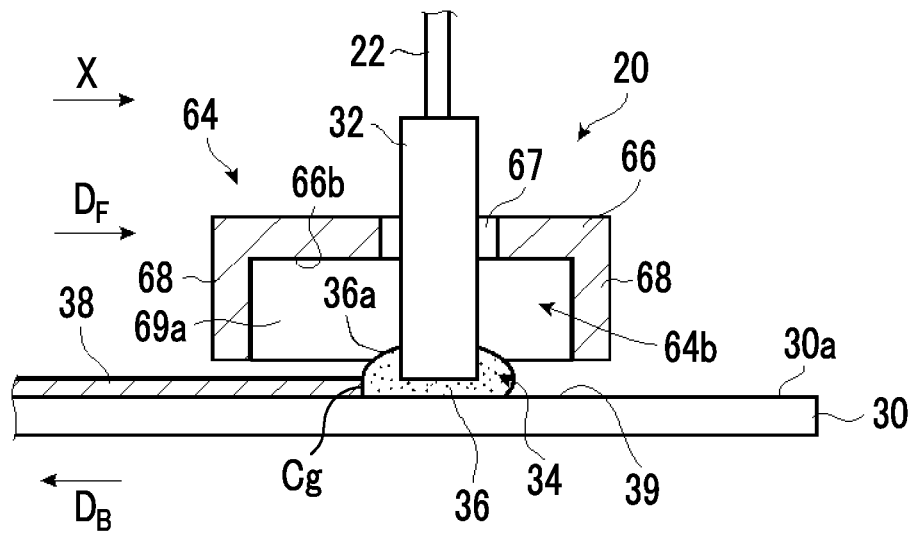
FIG. 17 is a schematic cross-sectional view illustrating a fourth example of the cover portion of the manufacturing device of the organic semiconductor film according to the embodiment of the present invention.
Figure 18:
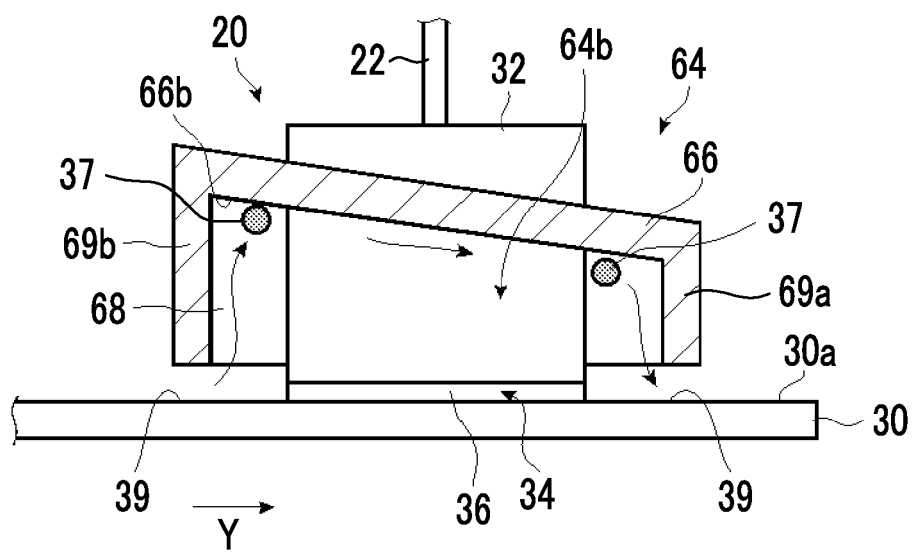
FIG. 18 is a front view of the fourth example of the cover portion.
Figure 19:
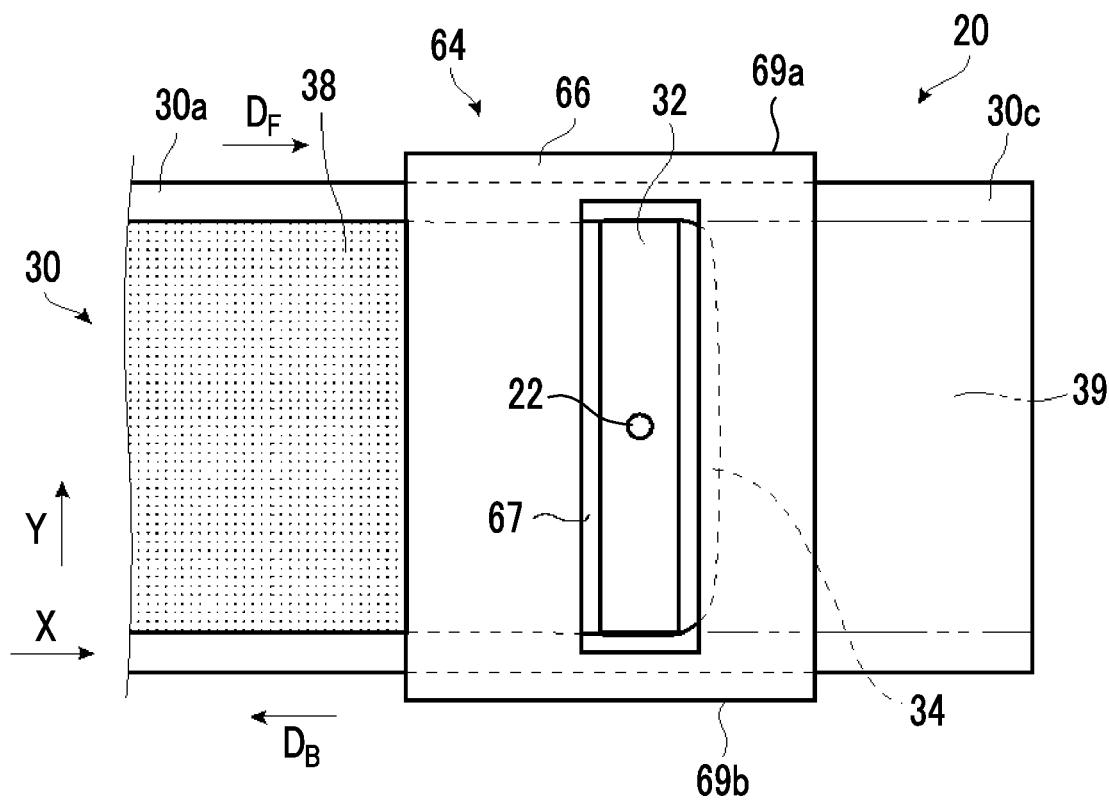
FIG. 19 is a schematic cross-sectional plan view illustrating the fourth example of the cover portion.

FIG. 17 is a schematic cross-sectional view illustrating a fourth example of the cover portion of the manufacturing device of the organic semiconductor film according to the embodiment of the present invention, FIG. 18 is a front view of the fourth example of the cover portion, and FIG. 19 is a schematic cross-sectional plan view illustrating the fourth example of the cover portion.

In FIGS. 17 to 19, the same components as in the coating member 20 and the cover portion 50 illustrated in FIGS. 2 and 3 are denoted by the same reference numerals, and detailed descriptions thereof are omitted.

The cover portion 64 illustrated in FIGS. 17 to 19 is different from the cover portion 50 illustrated in FIGS. 2 and 3, in that a tilted surface 66b that is tilted in the Y direction is provided and the deposit 37 falls on the film-unformed region 39 on the Y direction side of the organic semiconductor film 38, and the other configuration is the same as the coating member 20 and the cover portion 50 illustrated in FIGS. 2 and 3. In the cover portion 64, the tilted surface 66b is a guide.

In the cover portion 64, as illustrated in FIG. 17, flat surface portions 68 are provided in end portions on both sides of a tilted portion 66 in the X direction. As illustrated in FIG. 18, a side portion 69a and a side portion 69b are connected to the end portions of the tilted portion 66 in the Y direction. The tilted portion 66 is monotonically come close to the surface 30a of the substrate 30 to the Y direction, and the side portion 69a is shorter than the side portion 69b. An opening portion 67 to which the coating blade 32 is inserted is provided in the tilted portion 66. The circumference of the coating blade 32 is covered with the cover portion 64 together with the liquid reservoir 34 and the crystal growth portion Cg. In this manner, in the cover portion 64, the tilted surface 66b that the crystal growth portion Cg faces in a cross section in the Y direction orthogonal to the X direction is tilted.

The back surface of the tilted portion 66 is the tilted surface 66b, and the deposit 37 formed of the solvent of the organic semiconductor solution 36 on the tilted surface 66b is guided to the film-unformed region 39 of the Y direction of the organic semiconductor film 38. In the film-unformed region 39 of the Y direction of the organic semiconductor film 38, the organic semiconductor film 38 is not formed.

In this manner, the cover portion 64 of which the tilt direction is the Y direction may also guide the deposit 37 to the film-unformed region 39 in the same manner as the cover portion 50 of FIGS. 2 and 3, and it is possible to obtain the high quality organic semiconductor film 38 with high crystallinity.

The cover portion 64 is to guide the deposit 37 to the film-unformed region 39 which is on the side of the organic semiconductor film 38 and in which the organic semiconductor film 38 is not formed, and is different from the region in which the organic semiconductor film 38 of the cover portion 50 is to be formed. Therefore, the deposit 37 is not included in the organic semiconductor film 38.

Also in the cover portion 64, the solvent vapor pressure of an inside portion 64b may be increased in the same manner as in the cover portion 50, and the evaporation rate of the solvent may be suppressed.

Also in the cover portion 64 illustrated in FIGS. 17 and 18, the heating unit 23 may be provided, and the vapor of the solvent may be supplied to the inside of the cover portion 64 by the vapor supply portion 25a. The cover portion 64 and the coating blade 32 may be integrated. Among these, at least two of these may be combined or all of those may be combined.

Figure 20:
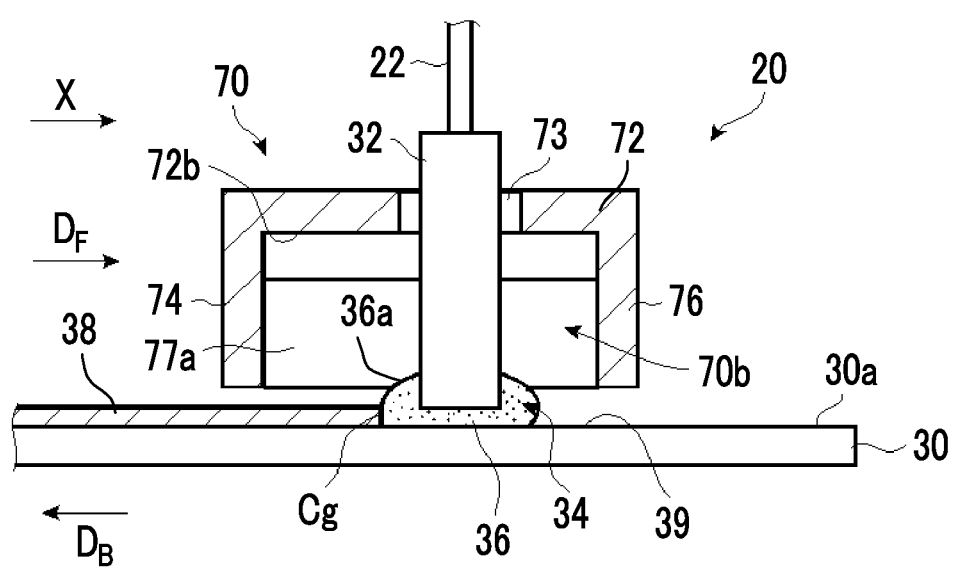
FIG. 20 is a schematic cross-sectional view illustrating a fifth example of the cover portion of the manufacturing device of the organic semiconductor film according to the embodiment of the present invention.
Figure 21:
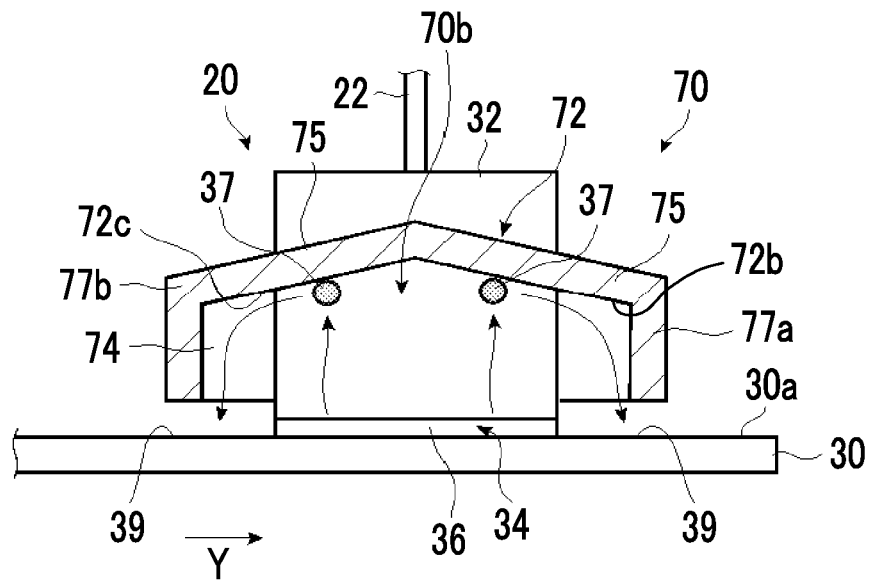
FIG. 21 is a front view of the fifth example of the cover portion.
Figure 22:
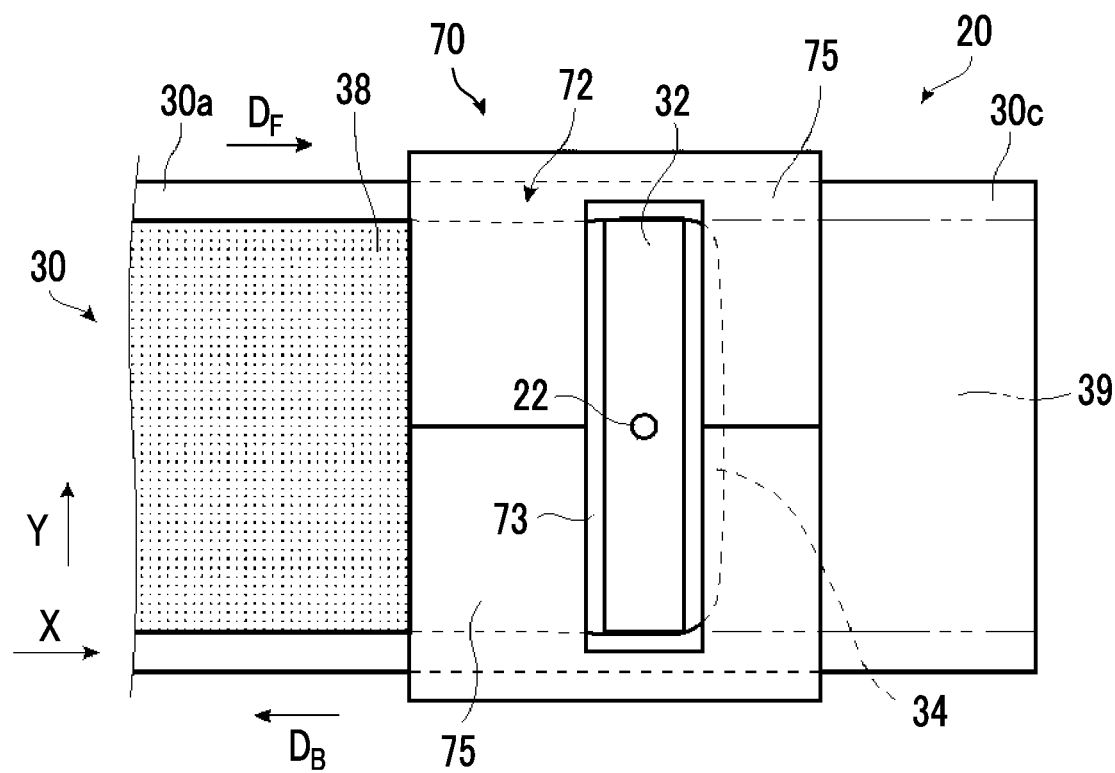
FIG. 22 is a schematic cross-sectional plan view illustrating the fifth example of the cover portion.

FIG. 20 is a schematic cross-sectional view illustrating a fifth example of the cover portion of the manufacturing device of the organic semiconductor film according to the embodiment of the present invention, FIG. 21 is a front view of the fifth example of the cover portion, and FIG. 22 is a schematic cross-sectional plan view illustrating the fifth example of the cover portion.

In FIGS. 20 to 22, the same components as in the coating member 20 and the cover portion 50 illustrated in FIGS. 2 and 3 are denoted by the same reference numerals, and detailed descriptions thereof are omitted.

The cover portion 70 illustrated in FIGS. 20 to 22 is different from the cover portion 50 illustrated in FIGS. 2 and 3, in that a tilted surface 72b that is tilted in the Y direction and a tilted surface 72c that is tilted in the direction opposite to the Y direction are provided and the deposit 37 falls on the film-unformed region 39 on the Y direction side of the organic semiconductor film 38 and the film-unformed region 39 on an opposite side to the Y direction, and the other configuration is the same as the coating member 20 and the cover portion 50 illustrated in FIGS. 2 and 3. In the cover portion 70, the tilted surfaces 72b and 72c are guides.

In the cover portion 70, as illustrated in FIG. 20, flat surface portions 74 and 76 are provided in end portions on both sides of a tilted portion 72 in the X direction. As illustrated in FIG. 21, a side portion 77a and a side portion 77b are provided at end portions of the tilted portion 72 in the Y direction. A tilted plate 75 is connected to the tilted portion 72 by changing the tilt direction, and the side portion 77a and the side portion 77b have the same length. The back surfaces of the tilted plates 75 are the tilted surfaces 72b and 72c. The tilted surface 72b is tilted so as to monotonically come close to the surface 30a of the substrate 30 in the Y direction. The tilted surface 72c has a direction opposite to that of the tilted surface 72b and is tilted so as to monotonically come close to the surface 30a of the substrate 30 in the direction opposite to the Y direction.

An opening portion 73 to which the coating blade 32 is inserted is provided in the tilted portion 72. The circumference of the coating blade 32 is covered with the cover portion 70 together with the liquid reservoir 34 and the crystal growth portion Cg. In this manner, in the cover portion 70, the tilted surfaces 72b and 72c that the crystal growth portion Cg faces in a cross section in the Y direction orthogonal to the X direction are tilted.

The back surfaces of the tilted plates 75 of the tilted portion 72 are the tilted surface 72b and 72c, and the deposit 37 formed of the solvent of the organic semiconductor solution 36 on the tilted surfaces 72b and 72c is guided to the film-unformed regions 39 of the direction Y and the direction opposite to the direction Y of the organic semiconductor film 38. The cover portion 70 is also to guide the deposit 37 to the film-unformed region 39 which is on the side of the organic semiconductor film 38 and in which the organic semiconductor film 38 is not formed, and is different from the region in which the organic semiconductor film 38 of the cover portion 50 is to be formed. Therefore, the deposit 37 is not included in the organic semiconductor film 38.

The cover portion 70 has the tilted plates 75 with the same tilt angle and different directions, so as to reduce the distance in which the deposit 37 reaches the film-unformed region 39, compared with the cover portion 50 of FIGS. 17 and 18. Therefore, even in a case where the deposit 37 is deposited to a portion above the crystal growth portion Cg, it is possible to suppress the falling on the crystal growth portion Cg. The deposit 37 may be guided to the film-unformed region 39, in the same manner as the cover portion 50 of FIGS. 2 and 3, and it is possible to obtain the high quality organic semiconductor film 38 with high crystallinity.

Also in the cover portion 70, the solvent vapor pressure of an inside portion 70b may be increased in the same manner as the cover portion 50, and the evaporation rate of the solvent may be suppressed.

Also in the cover portion 70 illustrated in FIGS. 20 and 21, the heating unit 23 may be provided, and the vapor of the solvent may be supplied to the inside of the cover portion 70 by the vapor supply portion 25a. The cover portion 70 and the coating blade 32 may be integrated. Among these, at least two of these may be combined or all of those may be combined.

Figure 23:
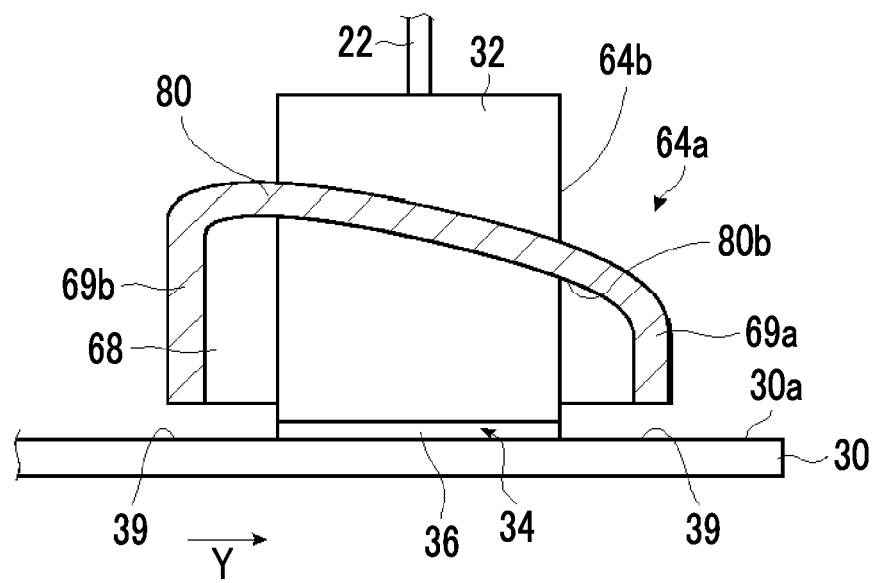
FIG. 23 is a schematic cross-sectional view illustrating a sixth example of the cover portion of the manufacturing device of the organic semiconductor film according to the embodiment of the present invention.
Figure 24:
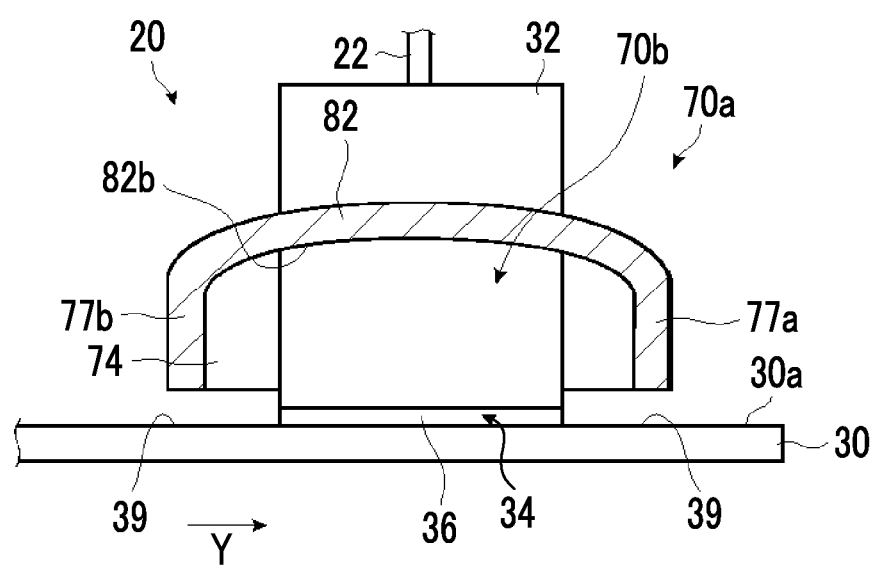
FIG. 24 is a schematic cross-sectional view illustrating a seventh example of the cover portion of the manufacturing device of the organic semiconductor film according to the embodiment of the present invention.
Figure 25:
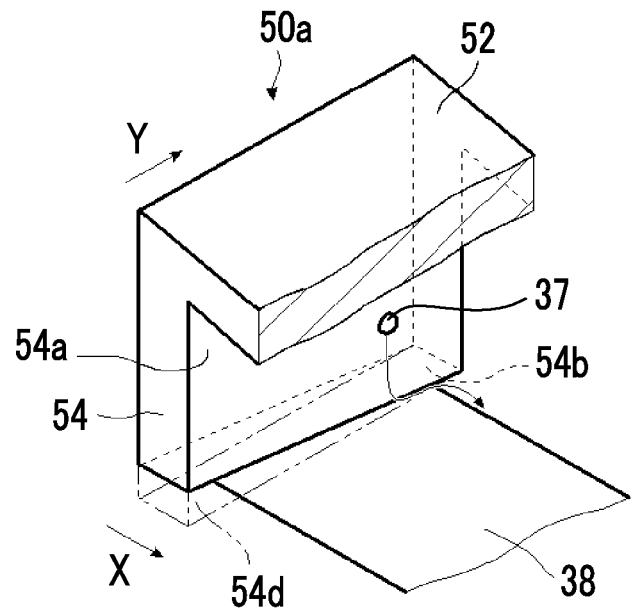
FIG. 25 is a schematic cross-sectional view illustrating an eighth example of the cover portion of the manufacturing device of the organic semiconductor film according to the embodiment of the present invention.
Figure 26:
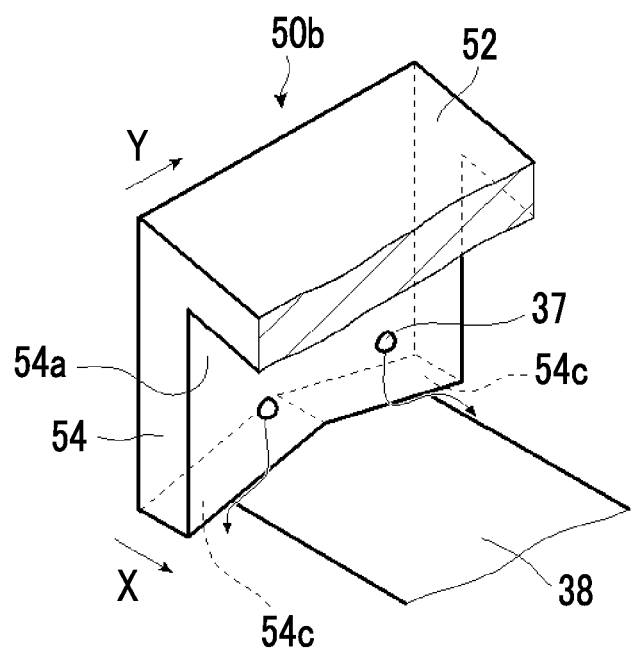
FIG. 26 is a schematic cross-sectional view illustrating a ninth example of the cover portion of the manufacturing device of the organic semiconductor film according to the embodiment of the present invention.

FIG. 23 is a schematic cross-sectional view illustrating a sixth example of the cover portion of the manufacturing device of the organic semiconductor film according to the embodiment of the present invention, FIG. 24 is a schematic cross-sectional view illustrating a seventh example of the cover portion of the manufacturing device of the organic semiconductor film according to the embodiment of the present invention, FIG. 25 is a schematic cross-sectional view illustrating an eighth example of the cover portion of the manufacturing device of the organic semiconductor film according to the embodiment of the present invention, and FIG. 26 is a schematic cross-sectional view illustrating a ninth example of the cover portion of the manufacturing device of the organic semiconductor film according to the embodiment of the present invention.

In FIG. 23, the same components as in the coating member 20 and the cover portion 64 illustrated in FIGS. 17 and 18 are denoted by the same reference numerals, and detailed descriptions thereof are omitted.

The cover portion 64a illustrated in FIG. 23 is different from the cover portion 64 illustrated in FIGS. 17 and 18, in that the back surface of the tilted portion 80 is the curved surface 80b, and the other configuration is the same as the cover portion 64 illustrated in FIGS. 17 and 18. In the cover portion 64a, the curved surface 80b is a guide.

The tilted portion 80 is curved in an arc shape on a cross section in the Y direction, the curved surface 59b guides the deposit 37 to the film-unformed region 39 of the Y direction of the organic semiconductor film 38, in the same manner as in the tilted surface 66b. The tilted portion 80 includes a tilt of which a distance from the surface 30a of the substrate 30 decreases in the Y direction.

Also in the cover portion 64a, the solvent vapor pressure of an inside portion 64b may be increased in the same manner as in the cover portion 50, and the evaporation rate of the solvent may be suppressed.

In FIG. 24, the same components as in the coating member 20 and the cover portion 70 illustrated in FIGS. 20 and 21 are denoted by the same reference numerals, and detailed descriptions thereof are omitted.

The cover portion 70a illustrated in FIG. 24 is different from the cover portion 70 illustrated in FIGS. 20 and 21, in that the back surface of the tilted portion 82 is the curved surface 82b, and the other configuration is the same as the cover portion 70 illustrated in FIGS. 20 and 21. In the cover portion 70a, the curved surface 82b is a guide.

In the cover portion 64 of FIG. 17 and the cover portion 64a of FIG. 23, a tilted surface of which a distance with the surface 30a of the substrate 30 decreases as it goes from the crystal growth portion Cg toward the liquid reservoir 34 may be combined.

Also in the cover portion 70 of FIG. 20 and the cover portion 70a of FIG. 24, a tilted surface of which a distance with the surface 30a of the substrate 30 decreases as it goes from the crystal growth portion Cg toward the liquid reservoir 34 may be combined.

The tilted portion 82 has an arc shape on a cross section in the Y direction, and, for example, the curved surface 82b is formed with an arc in which a distance to the surface 30a of the substrate 30 is longest at a midpoint of the Y direction. The curved surface 82b guides the deposit 37 to the film-unformed regions 39 in the Y direction and the direction opposite to the Y direction of the organic semiconductor film 38, in the same manner as in the tilted surface 72b and 72c.

Also in the cover portion 70a, the solvent vapor pressure of an inside portion 70b may be increased in the same manner as in the cover portion 50, and the evaporation rate of the solvent may be suppressed.

In FIGS. 25 and 26, the same components as in the cover portion 50 illustrated in FIGS. 2 and 3 are denoted by the same reference numerals, and detailed descriptions thereof are omitted.

In the same manner as in the cover portion 50a illustrated in FIG. 25, an undersurface 54b of the flat surface portion 54 may be a tilted surface that is tilted in the Y direction. The undersurface 54b of the flat surface portion 54 exhibits the same function as the tilted surface 66b that is tilted in the Y direction illustrated in FIG. 18. Accordingly, in a case where the deposit 37 is deposited to an inner surface 54a of the flat surface portion 54, even in a case where the deposit 37 falls on the organic semiconductor film 38 along the inner surface 54a, the deposit 37 is guided along the Y direction by the undersurface 54b, and the deposit 37 is guided to the side of the organic semiconductor film 38.

Reference numeral 54d illustrated in FIG. 25 denotes an undersurface of the flat surface portion 54 in a state of being not tilted.

In the same manner as in the cover portion 50b illustrated in FIG. 26, two tilted surfaces 54c in which the tilt direction of the undersurface of the flat surface portion 54 is changed may be provided. The two tilted surfaces 54c exhibits the same function as the two tilted surfaces 72b and 72c in which the tilt direction of the Y direction is changed as illustrated in FIG. 21. Accordingly, in a case where the deposit 37 is deposited to an inner surface 54a of the flat surface portion 54, even in a case where the deposit 37 falls on the organic semiconductor film 38 along the inner surface 54a, the deposit 37 is guided along the Y direction by the two tilted surfaces 54c, and the deposit 37 is guided to the side of the organic semiconductor film 38. The tilt angles of the two tilted surfaces 54c may be identical to or different from each other.

Figure 27:
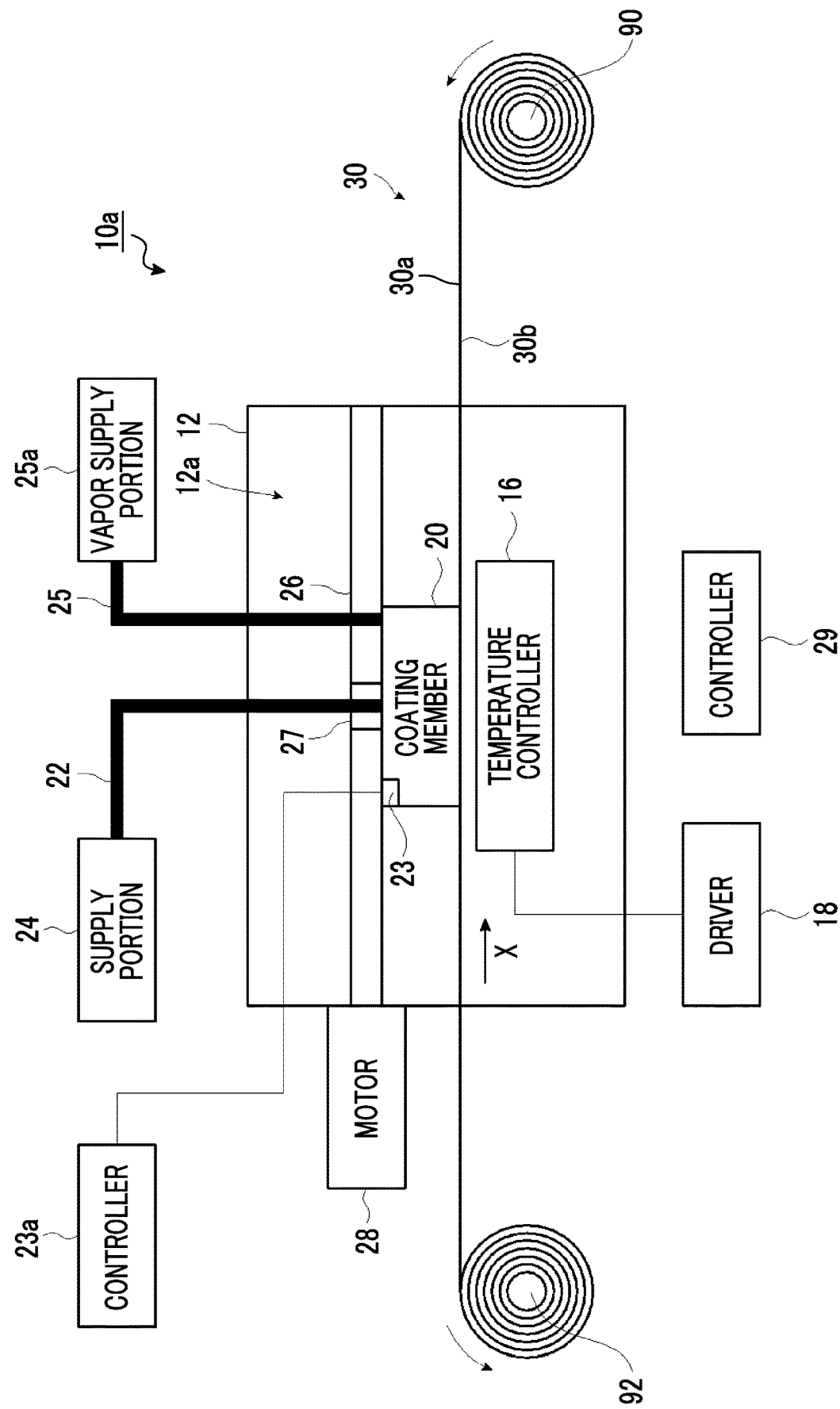
FIG. 27 is a schematic view illustrating another example of the manufacturing device of the organic semiconductor film according to the embodiment of the present invention.

The manufacturing device 10 is a single wafer type, but the method of manufacturing the organic semiconductor film is not limited to the single wafer type and may be a roll to roll type as in a manufacturing device 10a as illustrated in FIG. 27.

With respect to the manufacturing device 10a of FIG. 27, the same components as in the manufacturing device 10 illustrated in FIG. 1 are denoted by the same reference numerals, and detailed descriptions thereof are omitted.

The manufacturing device 10a illustrated in FIG. 27 is different from the manufacturing device 10 of FIG. 1, in that the stage 14 is not provided, a transport form of the substrate 30 is stretched to an unwinding roller 90 and a winding roller 92, the coating member 20 is disposed on the surface 30a side of the substrate 30, and the temperature controller 16 is disposed on the back surface 30b side, and the other configurations are the same as that in the manufacturing device 10 illustrated in FIG. 1.

In the manufacturing device 10a of FIG. 27, the temperature of the substrate 30 in the temperature controller 16 becomes a predetermined temperature, and the organic semiconductor film 38 is formed by the coating member 20. In a case where the organic semiconductor film 38 is formed, the coating member 20 may be moved in a state of being in contact with the organic semiconductor solution 36 (see FIG. 2) or the substrate 30 may be transported by being wound with the winding roller 92 in a state in which the coating member 20 is in contact with the organic semiconductor solution 36 (see FIG. 2).

Materials of each configuration and the like are described below.

The coating blade is formed, for example, by glass, quartz glass, and stainless steel.

For example, a glass substrate or a plastic substrate is used in the substrate 30.

Examples of the plastic substrate include polyesters such as polyethylene terephthalate (PET) and polyethylene naphthalate (PEN), polyolefins such as polyethylene (PE), polypropylene (PP), polystyrene, ethylene vinyl acetate (EVA), a cycloolefin polymer (COP), and a cycloolefin copolymer (COC), a vinyl resin, polycarbonate (PC), polyamide, polyimide, an acrylic resin, and triacetyl cellulose (TAC). The plastic substrate is not folded even in a case of being bent, and is used, for example, in the case of forming by a roll to roll method.

Generally, at least an organic semiconductor (organic semiconductor compound) and a solvent are included in the organic semiconductor solution 36.

The types of the organic semiconductor are not particularly limited, and well-known organic semiconductors may be used. Specific examples thereof include pentacenes such as 6,13-bis(triisopropylsilylethynyl) pentacene (TIPS pentacene), tetramethyl pentacene, and perfluoropentacene, anthradithiophenes such as 5,11-bis(triethylsilylethynyl) anthradithiophene (TES-ADT) and 2,8-difluoro-5,11-bis(triethylsilylethynyl) anthradithiophene (diF-TES-ADT), benzothienobenzothiophenes such as 2,7-diphenyl[1]benzothieno[3,2-b][1]benzothiophene (DPh-BTBT) and benzothienobenzothiophene (Cn-BTBT), dinaphthothienothiophenes such as 3,11-didecyl-dinaphtho[2,3-d:2',3'-d']-benzo[1,2-b:4,5-b']dithiophene (C10-DNBDT) and dinaphtho[2,3-b:2',3'-f]thieno[3,2-b]thiophene (Cn-DNTT), dioxaanthanthrenes such as perixanthenoxanthene, rubrenes, fullerenes such as C60 and [6,6]-phenyl-C61-butyric acid methyl ester (PCBM), phthalocyanines such as copper phthalocyanine and fluorinated copper phthalocyanine, polythiophenes such as poly(3-alkylthiophene) (P3RT), poly[5,5'-bis(3-dodecyl-2-thienyl 1)-2,2'-bithiophen] (PQT), and poly(3-hexylthiophene) (P3HT), and polythienothiophenes such as poly[2,5-bis(3-dodecylthiophene-2-yl)thieno[3,2-b]thiophene] (PBTTT).

The types of the solvent are not particularly limited, and examples thereof include an alcohol-based solvent such as methanol and ethanol; a ketone-based solvent such as acetone, methyl ethyl ketone, and methyl isobutyl ketone; an aromatic solvent such as benzene and thiophene; halogen (chlorine, bromine, and the like) substitution products (halogenated aromatic solvents) thereof; an ether-based solvent such as tetrahydrofuran and diethyl ether; an amide-based solvent such as dimethylformamide and dimethylacetamide; and a sulfonic acid-based solvent such as dimethyl sulfoxide and sulfolane.

The present invention basically has the configuration as above. In the above, the manufacturing device of an organic semiconductor film of the present invention has been described, but the present invention is not limited to the above embodiments, and it is obvious that various improvements and modifications may be performed without departing from the gist of the present invention.

EXAMPLES

Hereinafter, the manufacturing device of the organic semiconductor film according to the present invention is specifically described with reference to examples. A material, a reagent, an amount used, an amount of a material, a proportion, a treatment detail, a treatment order, and the like provided in the following examples may be suitably changed without departing from the gist of the present invention. The scope of the present invention should not be construed in a limited manner by the following specific examples.

In the present examples, the organic semiconductor layer formed with the organic semiconductor film was formed by using the manufacturing device of the organic semiconductor film so as to obtain a thin film transistor, and characteristics of a thin film transistor element was evaluated.

The thin film transistor was manufactured as described above so as to have a channel width W of 1 mm and a channel length L of 50 μm by using the bottom gate and top contact-type thin film transistor 40 illustrated in FIG. 7.

First, after a glass substrate was washed, a gate pattern was prepared by vacuum evaporation using a metal mask. Chromium (Cr) with a thickness of 10 nm was deposited as an adhesive layer, and then a gate electrode having a thickness of 40 nm was formed by using silver (Ag).

Subsequently, a polyimide insulating film having a thickness of 0.5 μm was formed on the glass substrate by spin coating and curing.

Subsequently, the glass substrate was provided on a hot plate on the stage, the temperature of the substrate is set to 100° C., the organic semiconductor solution 36 was applied at a moving speed of 1 mm/min or 5 mm/min, and an organic semiconductor film was formed, so as to obtain an organic semiconductor layer.

As the organic semiconductor solution 36, C10-DNBDT (3,11-didecyl-dinaphtho[2,3-d:2',3'-d']-benzo[1,2-b:4,5-b'] dithiophene) was used in the organic semiconductor, chlorobenzene was used in the solvent, and the solvent concentration was set to 0.05 mass %.

After the coating member and the cover portion provided above the substrate were fixed at a predetermined height, an organic semiconductor solution was supplied, so as to form a liquid reservoir. The supply amount of the organic semiconductor solution was adjusted according to the moving speed and the like so that the size of the liquid reservoir did not change during coating.

Subsequently, gold (Au) films having a thickness of 70 nm were formed as source and drain electrodes on the organic semiconductor layer by a vacuum evaporation method using a metal mask.

As the coating member and the cover shape, Type A illustrated in FIGS. 2 and 3, Type B illustrated in FIG. 17 Type C illustrated in FIGS. 20 and 21, Type D illustrated in FIG. 10, Type E illustrated in FIGS. 11 and 12, and Type F illustrated in FIG. 13 were used.

Figure 28:
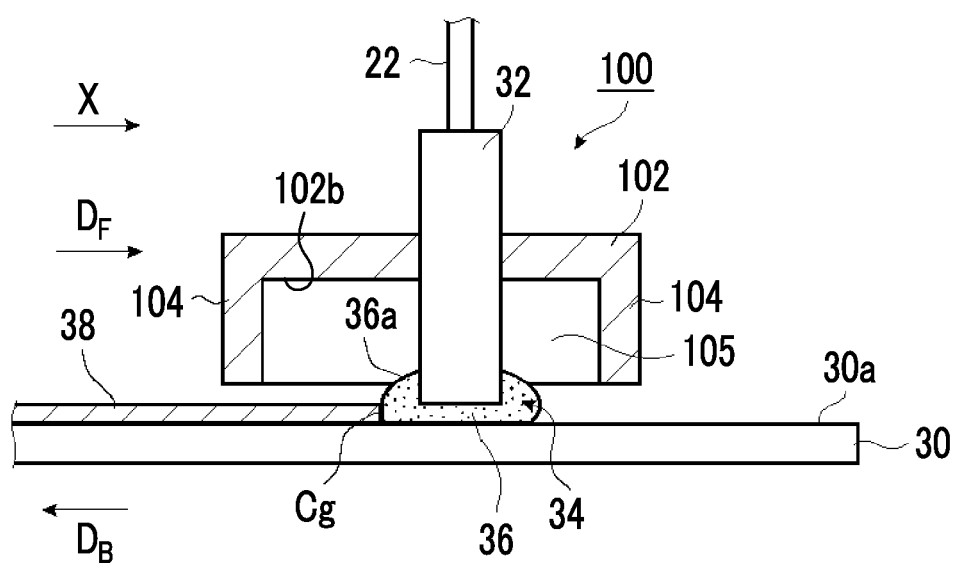
FIG. 28 is a schematic cross-sectional view illustrating the cover portion for comparison.

A cover portion 100 having the configuration illustrated in FIG. 28 was used in the comparative examples. In FIG. 28, the same components as in the coating member 20 and the cover portion 50 illustrated in FIGS. 2 and 3 are denoted by the same reference numerals, and detailed descriptions thereof are omitted.

The cover portion 100 illustrated in FIG. 28 has flat surface portions 104 at both ends of the X direction of the upper surface portion 102 having a surface 102b parallel to the surface 30a of the substrate 30. A side portion 105 is provided in the end portion of the Y direction of the upper surface portion 102 and has a cuboid shape overall.

The size of the coating member did not depend on the types, the length of the coating blade was set to 1 mm, and the width of the coating blade was set to 5 mm. The formed organic semiconductor film had a width of 5 mm and a length of 10 cm.

During the forming the organic semiconductor film, dripping was evaluated. Dripping was evaluated by checking the formed organic semiconductor film by a microscope. In a case where there is dripping, a concentrically aligned organic semiconductor crystal such as watermarks in the organic semiconductor film is observed. Therefore, with respect to the evaluation of the dripping, in a case where the concentrically aligned organic semiconductor crystal was observed, it was evaluated that there was dripping, and in a case where the concentrically aligned organic semiconductor crystal was not observed, it was evaluated that there was no dripping.

With respect to the characteristics of the thin film transistor element, the saturation mobility of the manufactured thin film transistor was measured by using a semiconductor parameter analyzer (4156C manufactured by Agilent). The characteristics of the thin film transistor element are presented as "TFT characteristics" in Table 1 below. In the section of the TFT characteristics in Table 1, "-" indicates that saturation mobility was not measured.

Based on the measured saturation mobility μ, the characteristics of the thin film transistor element were evaluated with the following evaluation standard.

a Saturation mobility μ was 1.0 cm$^2$/Vs or more
b Saturation mobility μ was 0.5 cm$^2$/Vs or more and less than 1.0 cm$^2$/Vs
c Saturation mobility μ was 0.01 cm$^2$/Vs or more and less than 0.5 cm$^2$/Vs
d Saturation mobility μ was less than 0.01 cm$^2$/Vs

TABLE 1

| | Shape of cover portion | Moving speed (mm/min) | Presence or absence of dripping | TFT Characteristics |
|---|---|---|---|---|
| Example 1 | A | 1 | No dripping | b |
| Example 2 | B | 1 | No dripping | b |
| Example 3 | C | 1 | No dripping | b |
| Example 4 | D | 1 | No dripping | a |
| Example 5 | E | 1 | No dripping | a |
| Example 6 | F | 1 | No dripping | a |
| Example 7 | A | 5 | No dripping | b |
| Example 8 | B | 5 | No dripping | b |
| Example 9 | C | 5 | No dripping | b |
| Example 10 | D | 5 | No dripping | a |
| Example 11 | E | 5 | No dripping | a |
| Example 12 | F | 5 | No dripping | a |
| Comparative Example 1 | Comparative Example | 1 | Dripping | — |
| Comparative Example 2 | — | 1 | No dripping | c |
| Comparative Example 3 | — | 5 | No dripping | d |

As presented in Table 1, in Examples 1 to 12, dripping did not occur, and the characteristics of the thin film transistor elements were satisfactory. Accordingly, in the manufacturing device of the organic semiconductor film of the present invention, it is obvious that the high quality organic semiconductor film with high crystallinity and high mobility was able to be manufactured.

In Examples 1 and 7, the deposit was guided to the region for forming the organic semiconductor film, and it was possible to obtain satisfactory characteristics of the thin film transistor element. In Examples 2, 3, 8, and 9, the deposit was guided to the side of the organic semiconductor film, and more satisfactory characteristics of the thin film transistor element were obtained.

In Examples 4 and 10, a heating unit was provided to the cover portion, the deposition of the deposit was able to be suppressed, and the solvent vapor pressure of the inside portion was able to be increased, such that the film quality of the organic semiconductor film became more satisfactory and more satisfactory characteristics of the thin film transistor element were obtained.

In Examples 5 and 11, the cover portion was integrated with the coating blade, the sealing degree was able to be increased, the solvent vapor pressure of the inside portion was able to be further increased, such that the film quality of the organic semiconductor film became more satisfactory and more satisfactory characteristics of the thin film transistor element were obtained.

In Examples 6 and 12, the vapor supply portion is provided to the cover portion, the solvent vapor pressure of the inside portion was further increased, and the evaporation rate of the solvent was able to be further suppressed, such that the film quality of the organic semiconductor film became more satisfactory and more satisfactory characteristics of the thin film transistor element were obtained.

In Comparative Example 1, since dripping occurred, saturation mobility was not measured, and the characteristics of the thin film transistor element were not evaluated.

In Comparative Example 2, there was no cover portion, dripping did not occur, but it was not able to form an organic semiconductor film having a good film quality in the set moving speed and the characteristics of the thin film transistor element were poor.

In Comparative Example 3, in a case where there was no cover portion, and in a case where the moving speed was fast, the decrease in the characteristics of the thin film transistor element was observed compared with Examples 7 to 12.

EXPLANATION OF REFERENCES 10, 10a: manufacturing device
12: casing
12a: inside portion
14: stage
16: temperature controller
18: driver
20: coating member
22: supply pipe
23: heating unit
23a: controller
24: supply portion
25: pipe
25a: vapor supply portion
26: guide rail
27: carriage
28: motor
29: controller
30, 42: substrate
30a: surface
30b: back surface
30c: region
32, 60: coating blade
32a: end surface
32b: side surface
32d: corner portion
34: liquid reservoir
36: organic semiconductor solution
36a: liquid surface
37: deposit
38: organic semiconductor film
39: film-unformed region
40: thin film transistor
42a: surface
43: gate electrode
44: insulating film
44a: surface
46: organic semiconductor layer
46a: surface
48a: source electrode
48b: drain electrode
50, 50a, 50b, 64, 70: cover portion
52, 59, 66, 72, 80, 82: tilted portion
Cg: crystal growth portion
$D_B$, $D_F$: direction
G: gap
X: first direction
Y: second direction
θ: tilt angle

What is claimed is:

1. A manufacturing device of an organic semiconductor film for manufacturing an organic semiconductor film by using an organic semiconductor solution, the manufacturing device comprising:
   a coating member that is disposed to face a surface of a substrate to be spaced therefrom for forming the organic semiconductor film and forms a liquid reservoir of the organic semiconductor solution between the coating member and the substrate;
   a supply portion that supplies the organic semiconductor solution to a portion between the substrate and the coating member; and
   a cover portion that covers at least a crystal growth portion of the organic semiconductor solution,
   wherein the cover portion includes a guide to which an evaporated solvent of the organic semiconductor solution is deposited and which guides a deposit formed of the evaporated solvent of the organic semiconductor solution to a film-unformed region of the organic semiconductor film, and
   wherein, while the organic semiconductor solution is supplied to a portion between the coating member and the surface of the substrate by the supply portion, the coating member is moved in a first direction parallel to the surface of the substrate in a state of being in contact with the organic semiconductor solution, to form the organic semiconductor film with the crystal growth portion as a starting point.

2. The manufacturing device of the organic semiconductor film according to claim 1,
   wherein the guide of the cover portion has a tilted portion.

3. The manufacturing device of the organic semiconductor film according to claim 1,
   wherein the guide of the cover portion is a tilted surface of which a distance with the surface of the substrate decreases from the crystal growth portion toward the liquid reservoir.

4. The manufacturing device of the organic semiconductor film according to claim 1,
   wherein the guide of the cover portion is a tilted surface that faces the crystal growth portion in a cross section of a second direction orthogonal to the first direction in a planar surface parallel to the surface of the substrate.

5. The manufacturing device of the organic semiconductor film according to claim 2,
   wherein the guide of the cover portion is a tilted surface that faces the crystal growth portion in a cross section of a second direction orthogonal to the first direction in a planar surface parallel to the surface of the substrate.

6. The manufacturing device of the organic semiconductor film according to claim 1, further comprising:
   a heating unit that heats at least a portion of the cover portion.

7. The manufacturing device of the organic semiconductor film according to claim 2, further comprising:
   a heating unit that heats at least a portion of the cover portion.

8. The manufacturing device of the organic semiconductor film according to claim 6,
   wherein the heating unit heats a region of the cover portion that faces the crystal growth portion.

9. The manufacturing device of the organic semiconductor film according to claim 7,
   wherein the heating unit heats a region of the cover portion that faces the crystal growth portion.

10. The manufacturing device of the organic semiconductor film according to claim 1,
    wherein the coating member and the cover portion are integrated.

11. The manufacturing device of the organic semiconductor film according to claim 2,
    wherein the coating member and the cover portion are integrated.

12. The manufacturing device of the organic semiconductor film according to claim 1,
    wherein the organic semiconductor solution includes a solvent, and the manufacturing device further comprises a vapor supply portion that supplies vapor of the solvent to an inside portion of the cover portion.

13. The manufacturing device of the organic semiconductor film according to claim 2,
    wherein the organic semiconductor solution includes a solvent, and the manufacturing device further comprises a vapor supply portion that supplies vapor of the solvent to an inside portion of the cover portion.

14. The manufacturing device of the organic semiconductor film according to claim 1,
wherein the coating member has a coating blade of which an end surface is planar, and the coating member is disposed such that the end surface of the coating blade is spaced to be parallel to the surface of the substrate, and the liquid reservoir is formed between the end surface of the coating blade and the surface of the substrate.

15. The manufacturing device of the organic semiconductor film according to claim 2,
wherein the coating member has a coating blade of which an end surface is planar, and the coating member is disposed such that the end surface of the coating blade is spaced to be parallel to the surface of the substrate, and the liquid reservoir is formed between the end surface of the coating blade and the surface of the substrate.

16. The manufacturing device of the organic semiconductor film according to claim 1,
wherein the coating member has a coating blade of which an end surface is tilted with respect to the surface of the substrate, the coating member is disposed such that the end surface of the coating blade is spaced to the surface of the substrate, and a liquid reservoir is formed between the end surface of the coating blade and the surface of the substrate.

17. The manufacturing device of the organic semiconductor film according to claim 2,
wherein the coating member has a coating blade of which an end surface is tilted with respect to the surface of the substrate, the coating member is disposed such that the end surface of the coating blade is spaced to the surface of the substrate, and a liquid reservoir is formed between the end surface of the coating blade and the surface of the substrate.

\* \* \* \* \*